(12) United States Patent
Marchand et al.

(10) Patent No.: US 11,095,308 B2
(45) Date of Patent: Aug. 17, 2021

(54) HYBRID ARCHITECTURES FOR CHECK NODE PROCESSING OF EXTENDED MIN-SUM (EMS) DECODING OF NON-BINARY LDPC CODES

(71) Applicant: UNIVERSITE DE BRETAGNE SUD, Lorient (FR)

(72) Inventors: Cédric Marchand, Queven (FR); Emmanuel Boutillon, Lorient (FR)

(73) Assignee: UNIVERSITE DE BRETAGNE SUD, Lorient (FR)

( * ) Notice: Subject to any disclaimer, the term of this patent is extended or adjusted under 35 U.S.C. 154(b) by 0 days.

(21) Appl. No.: 16/621,956

(22) PCT Filed: Jun. 7, 2018

(86) PCT No.: PCT/EP2018/064995
§ 371 (c)(1),
(2) Date: Dec. 12, 2019

(87) PCT Pub. No.: WO2018/234053
PCT Pub. Date: Dec. 27, 2018

(65) Prior Publication Data
US 2020/0177203 A1 Jun. 4, 2020

(30) Foreign Application Priority Data
Jun. 19, 2017 (EP) .................... 17305747

(51) Int. Cl.
*H03M 13/11* (2006.01)
(52) U.S. Cl.
CPC .... *H03M 13/1131* (2013.01); *H03M 13/1171* (2013.01)
(58) Field of Classification Search
CPC ............................. H03M 13/1131
See application file for complete search history.

(56) References Cited

U.S. PATENT DOCUMENTS

| 9,136,877 | B1* | 9/2015 | Chen | ................. H03M 13/1117 |
| 2018/0026658 | A1* | 1/2018 | Park | .................. H03M 13/1171 365/174 |

FOREIGN PATENT DOCUMENTS

| EP | 3092717 A1 | 11/2016 |
| WO | 2015/104275 A1 | 1/2015 |
| WO | 2016/170140 A1 | 10/2016 |

OTHER PUBLICATIONS

International Search Report & Written Opinion for PCT/EP2018/064995, dated Aug. 20, 2018.

(Continued)

*Primary Examiner* — Joseph D Torres
(74) *Attorney, Agent, or Firm* — Meagher Emanuel Laks Goldberg & Liao, LLP

(57) ABSTRACT

A check node processing unit configured to determine check node messages to decode a signal encoded using NB-LDPC code, the check node processing unit comprising: a data link to one or more message presorting units configured to determine permuted variable node messages by permuting variable node messages generated by one or more variable node processing units; a syndrome sub-check node configured to determine check node messages from a set of syndromes, the set of syndromes being determined from one or more intermediate messages computed from the permuted variable node messages; a forward-backward sub-check node configured to determine permuted check node messages from the intermediate messages; a switching unit configured to generate check node messages of given index from the check node messages or from the permuted check node messages depending on the giving index.

16 Claims, 8 Drawing Sheets

(56) References Cited

OTHER PUBLICATIONS

Marchand Cedric et al, "NB-LDPC check node with pre-sorted input", Proc., 9th International Symposium on Turbo Codes and Iterative Information Processing (ISTC), IEEE, Sep. 5, 2016 (Sep. 5, 2016), p. 196-200.

Schläfer Philipp et al, "Syndrome based check node processing of high order NB-LDPC decoders", Proc., IEEE 22nd International Conference on Telecommunications (ICT), IEEE, Apr. 27, 2015 (Apr. 27, 2015), p. 156-162.

Oussama Abassi et al, "A Novel Architecture for Elementary-Check-Node Processing in Nonbinary LDPC Decoders", IEEE Transactions on Circuits and Systems II: Express Briefs, vol. 64, No. 2, Feb. 1, 2017 (Feb. 1, 2017), p. 136-140.

Harb Hassan et al, "Pre-Sorted Forward-Backward NB-LDPC Check Node Architecture", Proc., IEEE International Workshop on Signal Processing Systems (SIPS), IEEE, Oct. 26, 2016 (Oct. 26, 2016), p. 142-147.

E. Boutillon and L. Conde-Canencia, "Bubble check: a simplified algorithm for elementary check node processing in extended min-sum nonbinary LDPC decoders", Electronics Letters, vol. 46, No. 9, pp. 633-634, Apr. 2010.

N. Wibereg, H-A. Loeliger, and R. Kotter, "Codes and Iterative Decoding on General Graphs", European Transactions on Telecommunications and Related Technologies, special issue on Turbo Coding, Jun. 1995.

D. Declercq and M. Fossorier, "Decoding algorithms for non-binary LDPC codes over GF", IEEE Transactions on Communications, vol. 55, No. 4, pp. 633-643, Apr. 2007.

E. Boutillon, L. Conde-Canencia, and A. Al Ghouwayel, "Design of a GF(64)-LDPC Decoder based on the EMS algorithm", IEEE Transactions on Circuits and Systems, vol. 60, No. 10, pp. 2644-2656, Oct. 2013.

L. Barnault and D. Declercq, Fast decoding algorithm for LDPC over GF(q), In Proceedings of IEEE Information Theory Workshop, pp. 70-73, Apr. 2003.

Korb, M. and Blanksby, A. "Non-Binary LDPC Codes over Finite Division Near Rings", 23rd International Conference on Telecommunications, 2016.

E. Li, F. Garcia-Herrero, D. Declercq, K. Gunnam, J. O. Lacruz and J. Valls, "Low latency T-EMS decoder for non-binary LDPC codes," 2013 Asilomar Conference on Signals, Systems and Computers, Pacific Grove, CA, 2013, pp. 831-835.

V. Savin, "Min-max decoding for nonbinary LDPC codes", In Proceedings of IEEE International Symposium on Information Theory, pp. 960-964, Jul. 2008.

P. Schlafer, et al., "A new Architecture for High Speed, Low Latency NB-LDPC Check Node Processing", In Proceedings of IEEE International Symposium on Personal, Indoor and Mobile Radio Communications, Aug. 2015.

V. Rybalkin, P. Schlafer and N. Wehn, "A New Architecture for High Speed, Low Latency NB-LDPC Check Node Processing for GF(256)", In Proceedings of IEEE 83rd Vehicular Technology Conference (VTC Spring), Nanjing, pp. 1-5, 2016.

J. O. Lacruz, F. García-Herrero, J. Valls and D. Declercq, "One Minimum Only Trellis Decoder for Non-Binary Low-Density Parity-Check Codes", in IEEE Transactions on Circuits and Systems I: Regular Papers, vol. 62, No. 1, pp. 177-184, Jan. 2015.

P. Schlafer, N. When, M. Alles, T. Lehnigk-Emden, and E. Boutillon, "Syndrome based check node processing of high order NB-LDPC decoders", In Proceedings of the International Conference on Telecommunications, pp. 156-162, Apr. 2015.

* cited by examiner

HYBRID ARCHITECTURES FOR CHECK NODE PROCESSING OF EXTENDED MIN-SUM (EMS) DECODING OF NON-BINARY LDPC CODES

The invention generally relates to digital communications, and in particular to methods and devices for decoding a signal encoded using an error correcting code.

BACKGROUND

Error correcting codes are implemented in various data processing systems and devices for ensuring a protection of data against errors that are introduced during data transmission or storage in the presence of noise and/or interference. Coding consists in adding redundant data to the original data, the redundant data enabling the detection and/or the correction of errors.

Error correcting codes are implemented in a plethora of devices and systems applied for example in data communication and/or storage. Exemplary applications comprise voice and multimedia transmission for instance in wireless ad-hoc networks (e.g. standardized in W-Fi 802.11), in radio communication systems (e.g. in 3 G, 4 G/LTE, 5 G and beyond, etc.), in optical communication systems, and in digital video broadcasting (e.g. standardized in DVB-C2, DVB-S2 X, and DVB-T2).

Linear error correcting codes are advantageous given that they require lower implementation complexity than non-linear error correcting codes. Exemplary linear error correcting codes comprise convolutional codes and linear block codes such as Hamming codes, Reed-Solomon codes, Turbo codes, Polar codes, and Low-Density Parity-Check (LDPC) codes.

LDPC codes, in particular, are very efficient. Long binary LDPC codes are proven to perform close to the Shannon limit; they provide high transmission rates that approach the maximum amount of information that can be transmitted over a transmission channel. Non-binary LDPC codes are very efficient in providing high-spectral efficiency coding and perform better than binary LDPC codes. However, in order to reach such gains and outperformance, developing low-complexity decoding algorithms for non-binary codes is required, especially for high spectral efficiency communications.

Decoding of signals encoded using linear block codes in general, and LDPC codes in particular, can be performed using iterative message passing algorithms. Message passing algorithms are based on exchanging messages representative of the encoded data between check node processing units and variable node processing units associated with a graph representation of the used code.

Exemplary decoding algorithms for binary codes, such as binary LDPC codes, comprise the 'sum-product' algorithm and the Thin-sum' algorithm, disclosed both in "N. Wibereg, H-A. Loeliger, and R. Kotter, Codes and Iterative Decoding on General Graphs, European Transactions on Telecommunications and Related Technologies, special issue on Turbo Coding, June 1995".

Exemplary decoding algorithms for non-binary codes, such as non-binary LDPC codes, comprise:
the 'q-aray sum-product' algorithm disclosed for example in "L. Barnault and D. Declercq, Fast decoding algorithm for LDPC over GF(q), In Proceedings of IEEE Information Theory Workshop, pages 70-73, April 2003";
the 'min-max' algorithm disclosed for example in "V. Savin, Min-max decoding for non-binary LDPC codes, In Proceedings of IEEE International Symposium on Information Theory, pages 960-964, July 2008";
the 'extended min-sum' (EMS) algorithm disclosed for example in "D. Declercq and M. Fossorier, Decoding algorithms for non-binary LDPC codes over GF, IEEE Transactions on Communications, vol, 55, no. 4, pages 633-643, April 2007", and
the 'Trellis EMS decoder' disclosed for examples in "J. O. Lacruz, F. Garcia-Herrero, J. Valls and D. Declercq, One Minimum Only Trellis Decoder for Non-Binary Low-Density Parity-Check Codes, in IEEE Transactions on Circuits and Systems I: Regular Papers, vol. 62, no. 1, pages 177-184, January 2015" and "E. Li, F. Garcia-Herrero, D. Declercq, K. Gunnam, J. O. Lacruz and J. Valls, "Low latency T-EMS decoder for non-binary LDPC codes," 2013 Asilomar Conference on Signals, Systems and Computers, Pacific Grove, C A, 2013, pp. 831-835".

The EMS algorithm is based on logarithmic-scale computations for reducing the computational complexity by transforming product operations to simple summation operations. Compared with other existing iterative decoding algorithms, the EMS algorithm gives a good trade-off between hardware complexity and communication performance. Nevertheless, the EMS algorithm still requires significant computational and storage resources which may not be available in practical devices or systems used for example in real-time applications or in systems which demand high throughput and a significantly reduced latency.

The largest computational complexity involved during the decoding process using the EMS decoding stems from the computations performed at the check node processing units.

Existing architectures used for check node processing in application to the EMS algorithm comprise a 'forward-backward' architecture and a 'syndrome-based' architecture.

The forward-backward architecture relies on a serial calculation involving elementary computations performed by a plurality of elementary check node processors. Exemplary algorithms for elementary check node processing comprise:
the 'Bubble check' algorithm disclosed in "E. Boutillon and L. Conde-Canencia, Bubble check: a simplified algorithm for elementary check node processing in extended min-sum non-binary LDPC decoders, Electronics Letters, vol. 46, no. 9, pp. 633-634, April 2010", and
an improved version of the 'Bubble check' algorithm known as 'L-Bubble check' disclosed "E. Boutillon, L. Conde-Canencia, and A. Al Ghouwayel, Design of a GF(64)-LDPC Decoder based on the EMS algorithm, IEEE Transactions on Circuits and Systems, vol. 60, no. 10, pages 2644-2656, October 2013".

The intermediate results generated by the various elementary check node processors are reused enabling a reduction of the hardware cost. However, this architecture introduces latency and degrades the throughput.

The syndrome-based architecture is particularly efficient for decoding high-order non-binary codes. The computation of exchanged messages using this architecture relies on a computation of syndromes carrying information representative of the encoded data. The syndrome-based architecture is disclosed for instance in:
"P. Schlafer, N. When, M. Alles, T. Lehnigk-Emden, and E. Boutillon, Syndrome based check node processing of high order NB-LDPC decoders, In Proceedings of the International Conference on Telecommunications, pages 156-162, April 2015";
"P. Schlafer, et al., A new Architecture for High Speed, Low Latency NB-LDPC Check Node Processing, In Proceedings of IEEE International Symposium on Personal, Indoor and Mobile Radio Communications, August 2015"; and "V. Rybalkin, P. Schlafer and N. Wehn, A New Architecture for High Speed, Low Latency NB-LDPC Check Node Processing for GF(256), In Proceedings of IEEE 83 rd Vehicular Technology Conference (VTC Spring), Nanjing, pages 1-5, 2016".

The syndrome-based architecture allows for massive parallel implementations and thus high throughput and low latency. However, the calculation and sorting of the syndromes introduces a high complexity which increases with the number of messages processed by a check node processing unit, limiting thus the application of the syndrome-based architecture for high coding rate with high value of processed messages.

There is accordingly a need for developing low-complexity architectures for check node processing providing high throughput and low-latency without performance loss.

SUMMARY

In order to address these and other problems, there is provided a check node processing unit configured to determine at least two check node messages in a decoder to decode a signal encoded using a NB-LDPC code. The check node processing unit comprises:

a data link to one or more message presorting units configured to determine at least three permuted variable node messages by permuting at least three variable node messages generated by one or more variable node processing units. Each variable node message comprises components, a component comprising a symbol and a reliability metrics associated with the symbol;

a syndrome sub-check node configured to determine check node messages from a set of syndromes, the set of syndromes being determined from one or more intermediate messages computed from the at least three permuted variable node messages;

a forward-backward sub-check node configured to determine permuted check node messages at least from one of said one or more intermediate messages.

a switching unit configured to generate each check node message of a given index from the check node messages determined by the at least one syndrome sub-check node or from the permuted check node messages determined at the at least a forward-backward sub-check node depending on said given index.

According to some embodiments, the message presorting unit may be configured to determine the permuted variable node messages by applying one or more permutations to the at least three variable node messages depending on the reliability metrics comprised in said at least three variable node messages. Each permutation may be associated with components extracted from the variable node messages according to a permutation index and may be applied to permute the variable node messages according to a given order of the reliability metrics comprised in the extracted components.

According to some embodiments, the check node processing unit may be configured to exchange the check node messages and at least three variable node messages with at least one variable node processing unit during a number of iterations. The one or more message presorting units may be configured to determine the number of the one or more permutations based on one or more of a signal-to-noise ratio, a number of components comprised in the at least three variable node messages, the reliability metrics comprised in some of the components in the at least three variable node messages, the NB-LDPC code, and the number of iterations.

According to some embodiments, the syndrome sub-check node may comprise a syndrome calculation unit configured to determine the set of syndromes from the at least three permuted variable node messages, a syndrome comprising a symbol, a reliability metrics associated with the symbol and a binary vector comprising a binary value in association with each of the at least two check node messages. The syndrome calculation unit may be configured to:

determine the symbol comprised in each syndrome by applying, to at least some of the symbols comprised in the at least three permuted variable node messages, an addition operation over an algebraic structure;

determine the reliability metrics associated with each symbol comprised in each syndrome by applying an addition operation over a given algebraic structure chosen in a group comprising the field of real numbers, the field of integer numbers, and the field of natural numbers, the addition operation being applied to at least some of the reliability metrics comprised in the at least three permuted variable node messages.

According to some embodiments, the syndrome calculation unit may be configured to determine an initial binary value in association with each component of the at least three permuted variable node messages depending on the reliability metrics associated with the symbols comprised in the at least three permuted variable node messages. The syndrome calculation unit may be further configured to determine the binary vector comprised in each syndrome by applying a vector concatenation operation to the initial binary values associated with at least some of the components comprised in the at least three permuted variable node messages.

In some embodiments, the syndrome calculation unit may be configured to determine, for each of the least three permuted variable node messages, an initial binary value equal to a predefined first value in association with the component comprising the most reliable symbol and an initial binary value equal to a predefined second value in association with the remaining components.

According to some embodiments, the syndrome sub-check node may be configured to determine one or more intermediate messages using at least one elementary check node processors, an elementary check node processor being configured to determine an intermediate message from a first message and a second message. The first message and second message may be derived from the at least three permuted variable node messages. An intermediate message may comprise one or more intermediate components and intermediate binary vectors associated with each intermediate component. Each intermediate component may comprise a symbol and a reliability metrics associated with the symbol. The one or more intermediate components may be sorted according to a given order of the reliability metrics, the set of syndromes being determined from the intermediate message determined from all of the at least three permuted variable node messages.

According to some embodiments, an elementary check node processor may be configured to:

determine a set of auxiliary components from the components of the first message and second message, an auxiliary component comprising a symbol and a reliability metrics associated with the symbol;

sort the auxiliary components according to a given order of the reliability metrics comprised in said auxiliary components;

determine a counter in association with each auxiliary component, said counter being determined depending on a signal-to-noise ratio and/or on the NB-LDPC code;

determine the intermediate components by selecting, among the auxiliary components, components depending on the counters associated with said auxiliary components.

According to some embodiments, an elementary check node processor may be configured to determine an intermediate message from a first message comprising two or more components and a second message comprising one component, the intermediate message comprising at least two intermediate components.

According to some embodiments, an elementary check node processor may be configured to determine an intermediate message from a first message comprising two components and a second message comprising two or more components, the determined intermediate message comprising at least three intermediate components.

According to some embodiments, an elementary check node processor may be configured to determine an intermediate message comprising one intermediate component, the one intermediate component being determined from the most reliable component comprised in a first message and the most reliable component comprised in a second message.

In some embodiments, a syndrome sub-check node may further comprise:

a decorrelation and permutation unit configured, for each check node message of a given index, to:
  determine a permuted index by applying to the given index the inverse of the one or more permutations;
  select valid syndromes in the set of syndromes, a valid syndrome comprising a binary value associated with the permuted index equal to a given value;
  determine candidate check node components from the valid syndromes;

a selection unit configured to determine check node messages by selecting, among each candidate check node message, a predefined number of components depending on the reliability metrics comprised in the candidate check node components.

According to some embodiments, a forward-backward sub-check node may comprise:

a calculation unit configured to determine, at least from one intermediate message, a candidate permuted check node message in association with each of the check node messages, a candidate permuted check node message comprising one or more candidate components comprising each a symbol and a reliability metrics associated with the symbol;

a processing unit configured to determine a permuted check node message from each candidate permuted check node message depending on the reliability metrics comprised in the candidate components.

In some embodiments, the switching unit may be configured to determine each check node message of a given index by:
  associating said each check node message with one of the permuted check node messages determined by the forward-backward sub-check node if the index of one of the permuted check node messages is equal to the given index;
  associating said each check node message with one of the check node messages determined by the syndrome sub-check node (31) if none of the permuted check node messages is of an index equal to the given index.

According to some embodiments, the decoder may comprise at least two check node processing units and at least one block division unit, the block division unit being configured to perform a division of at least one check node processing unit into at least one syndrome sub-check node and at least one forward-backward sub-check node, at least one of the at least two check node processing units being not divided into blocks of sub-check nodes.

There is also provided a method of determining at least two check node messages in a check node processing unit. The method may comprise:

acquiring from one or more message presorting units at least three permuted variable node messages by permuting at least three variable node messages generated by one or more variable node processing units;

determining at a syndrome sub-check node check node messages from a set of syndromes, the set of syndromes being determined from one or more intermediate messages computed from the at least three permuted variable node messages;

determining at a forward-backward sub-check node permuted check node messages at least from one of the one or more intermediate messages;

determining at a switching unit each check node message of a given index from the check node messages determined by the at least one syndrome sub-check node or from the at least one permuted check node message determined by the at least one forward-backward sub-check node depending on the given index.

Advantageously, the block division of check node processing units according to the various embodiments of the invention enables a computation of the check node messages by blocks, allowing a significant reduction of the computational complexity with no performance loss.

Advantageously, the provided hybrid architectures combining the syndrome-based architecture and the forward-backward architecture enable a significant reduction of the computational complexity involved in the check node processing. Such architectures combine the benefits of the syndrome-based architecture in terms of parallelized implementations, high throughputs and low latency in particular for high-order codes with the benefits of the forward-backward architectures in terms of low computational resources.

Advantageously, the provided presorting techniques enable to dynamically change the order of the variable node messages in order to separate the variable node components with reliable decisions from the ones with low reliabilities. This polarization of the variable node messages enables advantageously the reduction of the number of syndromes required to determine check node messages.

Further, in combination with the provided presorting techniques, the proposed hybrid architectures enable to adapt the architecture used for the computation of the check node messages to the reliability of the components comprised in the variable node messages. Further advantages of the present invention will become clear to the skilled person upon examination of the drawings and the detailed description, provided for illustration purposes only.

BRIEF DESCRIPTION OF THE DRAWINGS

The accompanying drawings, which are incorporated in and constitute a part of this specification, illustrate various embodiments of the invention, together with the general description of the invention given above and the detailed description of the embodiments given below.

DETAILED DESCRIPTION

Embodiments of the present invention provide devices, methods, and computer program products for decoding a signal encoded using at least one error correcting code with a reduced computational complexity and a reduced latency. In particular, they provide efficient presorting techniques and check node processing architectures implemented in iterative decoders for decoding signals encoded using at least one non-binary error correcting code.

Methods, devices and computer program products according to the various embodiments may be implemented in several types of digital data transmission and storage devices and systems used in several types of applications. Exemplary devices and systems comprise but are not limited to computers, disks, laptops, phones, smartphones, recorders, base stations, drones, satellites, etc. Exemplary applications comprise magnetic and optical recording, digital television and video broadcasting, digital communications, etc.

The following description of some embodiments of the invention will be made with reference to digital communication systems, for illustration purposes only. However, the skilled person will readily understand that the various embodiments of the invention may be integrated in other types of systems used for other applications such as positioning systems and spacecraft systems.

Figure 1:
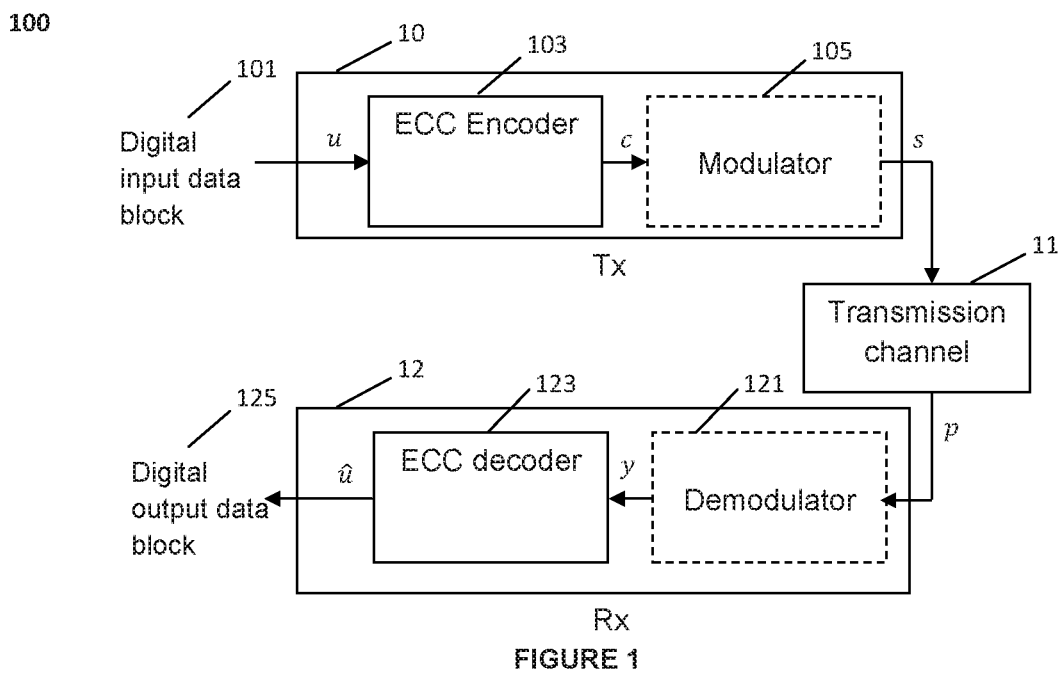
FIG. 1 is a block diagram of an exemplary application of the invention to communication systems, according to some embodiments.

Referring to FIG. 1, there is illustrated an exemplary application of the invention in a digital communication system 100. The communication system 100 may be for example:

wired;

wireless (e.g. radio or Visible Light communication systems);

optical (e.g. optical fiber-based);

acoustic (e.g. underwater acoustic communication systems);

molecular (used for example in underground structures, e.g. tunnels and pipelines or in underwater environments).

The communication system 100 may comprise at least a transmitter device 10 and a receiver device 12. The transmitter device 10 (also referred to hereinafter as a "transmitter") is configured to communicate data information to the receiver device 12 (also referred to hereinafter as "receiver") via the transmission channel 11.

In an application of the invention to wired communication systems such as computer networking systems, the transmitter 10 and/or receiver 12 may be any device configured to operate in a wired network. Exemplary devices in such applications comprise computers, routers or switches connected to a small or large area wired network. The transmission channel 11 may be in this case any type of physical cable used to ensure the transfer of data between the different connected devices.

In an application of the invention to wireless communication systems such as ad-hoc wireless networks, wireless sensor networks and radio communication systems, the transmitter 10 and receiver 12 may be any type of fixed or mobile wireless device configured to operate in a wireless environment. Exemplary devices in such applications comprise laptops, mobile phones and base stations. The transmission channel 11 may be in this case any wireless propagation medium. Further, the transmission channel 11 may accommodate several transmitters 10 and/or several receivers 12. In such embodiments, multiple access techniques and/or network coding techniques may be used in combination with error correcting codes. Exemplary multiple access techniques comprise Time Division Multiple Access (TDMA), Frequency Division Multiple Access (FDMA), Code Division Multiple Access (CDMA), and Space Division Multiple Access (SDMA).

In an application of the invention to optical communication systems such as optical fiber-based systems, the transmitter 10 and receiver 12 may be any optical transceiver device configured to respectively transmit and receive data information propagated over an optical link. The transmission channel 11 may be any optical fiber link designed to carry data over short or long distances. Exemplary applications using optical fiber links over short distances comprise high-capacity networks such as data center interconnections. Exemplary applications using optical fiber links over long distances comprise terrestrial and transoceanic transmissions. In such embodiments, the information symbols conveyed by the transmitter 10 may be carried by optical signals polarized according to the different polarization states of the fiber. The optical signals propagate along the fiber-based transmission channel 11, according to one or more propagation modes, until reaching the receiver 12. Exemplary optical communication systems comprise Polarization Division Multiplexing (PDM) and Mode Division Multiplexing (MDM) systems.

For any type of wired, wireless or optical communication systems, the transmission channel 11 may be any noisy channel. The noise may result from the thermal noise of the system components or the interfering radiation intercepted by antennas. Other exemplary sources of noise comprise switching, manual interruptions, electrical sparks and lightning. In some embodiments, the total noise may be modeled by an additive white Gaussian noise (AWGN).

Further, according to some embodiments in application to digital mass storage, the transmission channel 11 may be modeled for example by an erasure channel, a binary symmetric channel, or a Gaussian channel. In such embodiments, the transmission channel 11 may be any type of storage device that can be sent to (written on) and/or received from (read).

In addition, the transmitter 10 and receiver 12 may be equipped with single or multiple antennas. In particular, in the presence of multiple transmit and/or receive antennas, Space-Time coding and decoding techniques may be used in combination with error correcting coding and decoding.

Further, encoded data may be transmitted over one or multiple frequency bands. When encoded data are transmitted over multiple frequency bands, the modulator 105 may use multi-carrier modulation formats such as OFDM (acronym for Orthogonal Frequency Division Multiplexing) and FBMC (acronym for Filter Bank Multi-Carrier).

According to some embodiments of the invention, the transmitter 10 may comprise an error correcting code (ECC) encoder 103, configured to encode a digital input data block 101 denoted by u using a linear block error correcting code into a codeword vector denoted by c. The receiver 12 may be configured to receive a noisy copy p of the encoded data, or codeword vector, through the transmission channel 11. The receiver 12 may comprise an error correcting code decoder 123 configured to deliver a digital output data block 125 as an estimate it of the original digital input data block 101.

The digital input data 101 may be previously compressed before being encoded by the ECC encoder 103. Any source coding scheme (not shown in FIG. 1) adapted to increase the information throughput may be used to perform the compression. Data encoded by the ECC encoder 103 may be further modulated by a modulator 105. The modulator 105 may be configured to map the encoded data onto an analog signal s and to send it through the transmission channel 11.

The receiver 12 may comprise homologous processing means configured to perform the reverse functions. It may comprise a demodulator 121 configured to generate a signal γ by performing a demodulation of the received signal p from the transmission channel prior to ECC decoding by the ECC decoder 123. The demodulator 121 may be configured to move the received signal or channel output back into baseband and perform low-pass filtering, sampling and quantization. The data decoded by the ECC decoder 123 may be further decompressed using any source decoder (not shown in FIG. 1). The ECC decoder 123 may be configured to implement an iterative decoder (referred to as 'iterative decoding algorithm') involving a number of check node processing units according to the various embodiments of the invention.

The following description of some embodiments of the invention will be made with reference to linear block error correcting codes, for illustration purposes only. However, the skilled person will readily understand that the various embodiments of the invention apply to any linear codes comprising the convolutional codes and in general to any error correcting codes.

Accordingly, the ECC encoder 103 may implement a linear block error correcting code designated by (n,K); n and K referring respectively to the length of codeword vectors and the length of the encoded data block. The ECC encoder 103 encodes accordingly a data block u of length K into a codeword vector c, c being a vector of length n. The codeword c therefore comprises n elements, also referred to as "symbols".

A linear code $\mathcal{C}(n,K)$ may be represented in a matrix form using a generator matrix denoted by G and a parity-check matrix denoted by H. Using a row notation of vectors, the generator matrix G is of dimensions K×n while the parity-check matrix has dimensions of (n−K)×n. The two matrices are linked by the relation $G \cdot H^t = 0$. In addition, entries of both matrices belong to the algebraic structure over which the error correcting code is constructed. Using the matrix representation, any codeword vector c satisfies the equation $c \cdot H^t = 0$. This equation is also called "parity-check equation". It defines n−K parity-check constraints, designed to be satisfied by any codeword vector.

In association with the matrix representation, the linear code $\mathcal{C}(n,K)$ may be represented using a bipartite graph $\mathcal{H}$ termed "Tanner graph". This graph comprises n variable nodes and n−K check nodes.

Each variable node $vn \in \{1, 2, \ldots, n\}$ corresponds to a column of the parity-check matrix. Each check node $cn \in \{1, 2, \ldots, n-K\}$ corresponds to a row of the parity-check matrix, i.e. to a parity-check equation. A variable node vn is connected to a check node cn if the entry $H_{vn,cn}$ of the parity-check matrix is not equal to zero, i.e. if $H_{vn,cn} \neq 0$.

$\mathcal{H}_v(vn)$ denotes the set of the check nodes connected to the variable node vn. Similarly, $\mathcal{H}_c(cn)$ denotes the set of the variable nodes connected to the check node cn.

The degree of a variable node vn (respectively a check node cn) corresponds to the cardinality of the set $\mathcal{H}_v(vn)$ (respectively the cardinality of the set $\mathcal{H}_c(cn)$).

According to some embodiments, the algebraic structure of construction of the error correcting code may be any non-zero commutative division ring such as fields. Exemplary fields comprise the field of real numbers, the field of complex numbers, the field of rational numbers, and finite fields (also known as 'Galois fields').

The following description of some embodiments will be made with reference to finite fields, for illustration purposes only. However the skilled person will readily understand that the invention may be applied to any division rings-like algebraic structures such as non-zero commutative division rings and to any near-rings such as finite division near-rings. Insights on the design of non-binary error correcting codes over finite division near-rings can be found in the article "Non-binary LDPC codes over finite division near rings," 2016 23 rd International Conference on Telecommunications (ICT), Thessaloniki, 2016, pp. 1-7".

For linear codes constructed over Galois Fields, generally denoted by GF(q), where q≥2 designates the cardinality of the code, the symbols take values in GF(q). A codeword vector c is thus a vector of n symbols that each belong to GF(q). The code is binary if the symbols belong to GF(2). In contrast, when q>2, the code is qualified as non-binary.

The following description of some embodiments will be made with reference to an ECC encoder 103 encoding data using a non-binary LDPC code, for illustration purposes only. However, the skilled person will readily understand that the various embodiments of the invention also apply to other non-binary codes such as non-binary polar codes and in general to binary and non-binary linear block error correcting codes and non-binary turbo codes. Non-binary error correcting codes can advantageously be used for high spectral efficiency coding.

For exemplary purposes, in one embodiment, the ECC decoder 123 implements a non-binary LDPC codes decoder for decoding the data encoded by the ECC encoder 103 using a non-binary LDPC code.

The description of the invention is made with reference to the EMS algorithm. However, the skilled person will readily understand that the various embodiments apply to any iterative non-binary LDPC codes decoder such as the min-max and the T-EMS.

Figure 2:
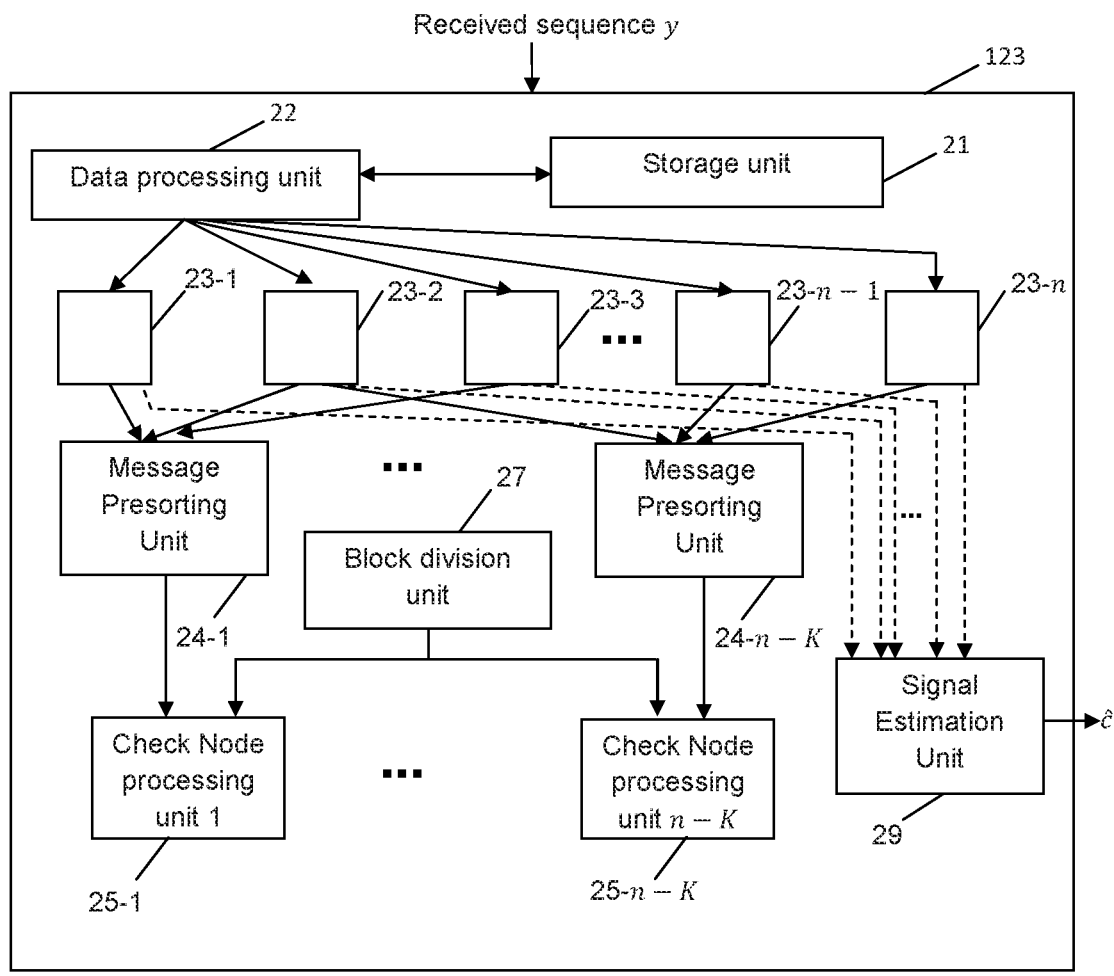
FIG. 2 is a block diagram of an error correcting code decoder, according to some embodiments in which presorted block division and decoding implementations of the EMS algorithm are considered.

Referring to FIG. 2, there is illustrated a structure of an iterative non-binary LDPC decoder 123 according to some embodiments using the EMS algorithm.

The iterative decoder 123 may be configured to determine an estimate ĉ of the transmitted codeword c by the transmitter 10 from a received noisy sequence y. It may process a signal over several iterations bringing it, at each iteration, closer to the transmitted codeword vector c.

The iterative decoder 123 may be configured to determine the estimate ĉ based on the Tanner graph representation of the code $\mathcal{C}$ (n,K) used at the transmitter 10. Each variable node in the Tanner graph maps to a variable node processing unit. Each check node in the Tanner graph maps to a check node processing unit.

Accordingly, the iterative decoder 123 may comprise n variable node processing units 23 (also denoted by 23-1 to 23-n or 23-vn with vn=1, . . . , n) and n–K check node processing units 25 (also denoted by 25-1 to 25-(n–K) or 25-cn with cn=1, . . . , n–K).

The variable node processing units 23-vn for vn=1, . . . , n and check node processing units 25-cn for cn=1, . . . , n–K may be configured to iteratively exchange messages to estimate the most reliable codeword ĉ from the noisy sequence y.

A message generated by a variable node processing unit 23-vn is referred to as 'variable node message'. Similarly, a message generated by a check node processing unit 25-cn is referred to as 'check node message'.

The iterative decoder 123 may comprise a storage unit 21 configured to store the received sequence y. It may also comprise a data processing unit 22 configured to determine intrinsic information and initial values of variable node messages and deliver them to the variable node processing units 23-vn for vn=1, . . . , n.

A variable node processing unit 23-vn may be configured to receive intrinsic information and to receive check node messages from the check node processing units 25-cn corresponding to the set $\mathcal{H}_v(vn)$. A variable node processing unit 23-vn may be further configured to process the received check node messages, compute local decisions, and deliver variable node messages to at least one check node processing unit 25-cn corresponding to the check nodes in the set $\mathcal{H}_v(vn)$.

Similarly, a check node processing unit 25-cn may be configured to process variable node messages sent by the variable node processing units 23-vn corresponding to the set $\mathcal{H}_c(cn)$. A check node processing unit 25-cn may be further configured to deliver check node messages to at least one variable node processing unit 23-vn corresponding to the variable nodes in the set $\mathcal{H}_c(cn)$.

The processing performed by the various variable node processing units 23-vn and check node processing units 25-cn may be implemented according to several scheduling mechanisms including, without limitation, the three examples described in the following.

According to a first implementation, all the variable node processing units 23-vn for vn=1, . . . , n, may be configured to operate in a first round and then all the check node processing units 25-cn, for cn=1, . . . , n–K, may be configured to update the check node messages to be delivered to the variable node processing units in their corresponding sets $\mathcal{H}_c(cn)$. This specific scheduling is known as "flooding scheduling". In particular, the check node processing units 25-cn may be configured to operate serially or in parallel, where from 2 to n–K check node processing units 25-cn may operate at the same time.

According to a second implementation based on a "horizontal scheduling", the check node processing units 25-cn, for cn=1, n–K, may be configured to operate serially, updating all variable node processing units 23-vn which are connected to them. In particular, a group of check node processing units 25-cn may be configured to operate in parallel, updating all connected variable node processing units 23-vn provided that there is no variable node processing unit 23-vn in conflict (e.g. when two check node processing units 25-cn are connected to the same variable node processing unit 23-vn).

According to a third implementation based on a "vertical scheduling", the variable node processing units 23-vn may be configured to operate serially, updating all check node processing units 25-cn which are connected to them.

The exchange of messages may be started by the variable node processing units 23-vn. It may terminate either if the processed signal satisfies the parity-check equation or if a maximum number of iterations is reached without meeting all parity-check constraints.

Accordingly, the iterative decoder 123 may comprise a signal estimation unit 29 configured to receive, at each iteration of the decoding process, the local decisions computed by the variable node processing units 23-vn and to:

deliver the processed signal as an estimate of the original codeword vector if the processed signal satisfies the parity-check equation; or declare a decoding failure but nevertheless output the codeword vector estimated at the last iteration if a maximum number of iterations is reached without meeting all parity-check constraints.

The exchanged messages between the variable node processing units 23-vn and the check node processing units 25-cn may carry data representative of the symbols.

According to some embodiments, the variable node and check node messages may carry values of the symbols and metrics measuring their reliabilities (also referred to hereinafter as 'reliability metrics'). The value of the reliability metrics is related to the reliability of the symbol. In such embodiments, each variable node and check node message may comprise q components, a component comprising:

a value of a symbol in GF(q), and a reliability metrics associated with the symbol.

In the following, the components comprised in variable node messages are referred to as 'variable node components' and the components comprised in check node messages are referred to as 'check node components'.

In some embodiments, the reliability metrics of a symbol may correspond to an estimated probability density function of the symbol which represents the probability that the symbol is correct. In particular, the reliability metrics may be represented in the log-domain by a logarithmic likelihood ratio (LLR) value.

According to some embodiments using the EMS algorithm, the variable node messages may be sorted and truncated so as to keep only the $n_{m,in}$ most reliable components, with $n_{m,in}$ being strictly lower than q. The sorting may be performed in a given order (for example by increasing or decreasing order) of the reliability metrics associated with the symbols. Further, the sorting and truncation operations may be performed by the variable node processing units 23-*vn* or by the check node processing unit 25-*cn*.

The computational complexity of the iterative decoding process is dominated by the computations performed by the check node processing units 25-*cn*. In embodiments using the EMS algorithm for decoding non-binary LDPC codes, there are provided variable node message presorting techniques and block division and decoding techniques enabling respectively the presorting of variable node massages, the division of a check node processing unit 25-*cn* into at least two blocks of sub-check nodes, and the computation of the check node messages by blocks. Each block of a sub-check node may be configured to receive at least one variable node message and to generate at least one check node message. The block computation of check node messages involves at least two blocks of sub-check nodes in which at least one block of sub-check node implements a syndrome-based architecture and at least one block of sub-check node implements a forward-backward-based architecture. The combination of variable node message presorting with a mix of syndrome-based and forward-backward-based architectures for the computation of check node messages enables a reduction of the computational complexity of the processing performed by the check node processing units 25-*cn* without sacrificing the decoding error performance.

Syndrome-based architectures include architectures in which the check node components are derived from syndromes, the syndromes being computed from the variable node messages. A syndrome comprises a symbol, a reliability metrics associated with said symbol, and a binary vector referred to as 'Discard Binary Vector' (DBV).

In syndrome-based architectures, the computation of check node messages from the variable node messages requires two steps. A first step is dedicated to compute a set of syndromes from all the variable node messages. At a second step, a decorrelation operation is performed in association with each check node message. The decorrelation operation consists in cancelling, from the computed syndromes, the contribution of the variable node message previously received from the variable node processing unit that is configured to receive the computed check node message.

Forward-backward architectures include architectures in which the check node messages are derived from intermediate results processed by elementary check node processors without performing the decorrelation process performed in syndrome-based architectures.

The aim of the presorting techniques, according to the various embodiments of the present invention, is to polarize the statistics of the variable node messages. The provided presorting techniques enable to dynamically change the order of the variable node messages processed by a check node processing unit 25-*cn* in order to separate the variable node components with reliable decisions from the ones with a low reliability.

Further, block division and computation of check node messages from presorted variable node messages using a combination of syndrome-based and forward-backward architectures enable to adapt the architecture used in each block for check node message computation to the reliability of the components comprised in the permuted variable node messages.

Accordingly, the iterative decoder 123 may comprise at least one message presorting unit 24 configured to permute at least three variable node processing messages, and a block division unit 27 configured to divide at least one check node processing unit 25-*cn* into at least two blocks of sub-check nodes using a set of block division parameters. The at least two blocks of sub-check nodes may comprise:

at least one block of sub-check node referred to as 'syndrome sub-check node' configured to determine at least one check node message by implementing a syndrome-based architecture. The at least one syndrome sub-check node may be further configured to determine at least one intermediate message and send it to at least one block of sub-check node, the at least one intermediate message being determined from at least two permuted variable node messages, and at least one block of sub-check node referred to as 'forward-backward sub-check node' configured to determine at least one check node message at least from one intermediate message received from one or more blocks of sub-check nodes, said at least one check node message being determined by implementing a forward-backward architecture.

According to some embodiments, the at least one message presorting unit 24 may be implemented within the check node processing units 25-*cn*.

In other embodiments (illustrated in FIG. 2), the at least one message presorting unit 24-*cn* may be implemented outside the check node processing units 25-*cn*. Accordingly and referring to FIG. 2, the decoder 123 may comprise at least one message presorting unit 24-*cn*, for cn taking values between 1 and n–K, configured to receive at least three variable node messages from the variable node processing units 23-*vn* and to deliver permuted variable node messages to at least one check node processing unit 25-*cn*.

In some embodiments (depicted in FIG. 2), the decoder 123 may comprise a message presorting unit 24-*cn* in association with each check node processing unit 25-*cn*, for cn=1, . . . , n–K. For example, this configuration may be used in embodiments in which the check node processing units 25-*cn* operate in parallel.

In other embodiments (not depicted in FIG. 2), the decoder 123 may comprise a message presorting unit in association with two or more of the check node processing units 25-*cn*. For example, this configuration may correspond to embodiments in which at least some of the check node processing units 25-*cn* operate in parallel and some of them operate serially.

The following description of some embodiments will be made with reference to a message presorting unit 24-*cn* in association with each check node processing unit 25-*cn*, for illustration purposes only. Further, in order to facilitate the understanding of the following description of some embodiments, a notation at the level of a check node processing unit 25-*cn* will be used in the following, with cn taking values between 1 and n–K. The degree of the check node processing unit 25-*cn* is denoted by $d_{cn}$, i.e. the corresponding check node in the Tanner graph $\mathcal{H}$ is connected to $d_{cn}$ variable nodes which constitute the set $\mathcal{H}_c(cn)$ Advantageously, the degree of the check node processing unit 25-*cn* may satisfy $d_{cn} \geq 3$.

Further, the following notations will be used:

$U_1, U_2, \ldots, U_{d_{cn}}$: refer to the variable node messages sent by the variable node processing units associated with the nodes in the set $\mathcal{H}_c(cn)$ to the check node processing unit 25-*cn*;

$UP_1, UP_2, \ldots, UP_{d_{cn}}$: designate the permuted variable node messages;

$V_1, V_2, \ldots, V_{d_{cn}}$: refer to the check node messages generated by the check node processing unit 25-*cn* to the variable node processing units 23-*vn* in the set $\mathcal{H}_c(cn)$, a check node message $V_i$ being of index i, the index taking values between 1 and $d_{cn}$.

The following description will be made with reference to some embodiments using the EMS algorithm based on sorting and truncation of the variable node messages, for illustration purposes only. In such embodiments, each variable node message $U_i$ comprises $n_{m,in}$ variable node components of a one-column vector representation given by:

$$U_i = \begin{pmatrix} U_i[n_{m,in}-1] \\ \vdots \\ U_i[1] \\ U_i[0] \end{pmatrix} \quad (1)$$

A variable node component $U_i[j]=(U_i^{\oplus}[j], U_i^+[j])$ for $j=0, \ldots, n_{m,in}-1$ comprises a symbol denoted by UN and the reliability metrics associated with this symbol, denoted by $U_i^+[j]$. The variable node components of each variable node message may be sorted such that the component comprising the most reliable symbol corresponds to the component $U_i[0]$, for $i=1, \ldots, d_{cn}$ and that $U_i^+[j+1] \geq U_i^+[j]$ for $j=0, \ldots, n_{m,in}-2$.

According to some embodiments, the message presorting unit 24-*cn* associated with the check node processing unit 25-*cn* may be configured to receive, from one or more variable node processing units 23-*vn*, at least three variable node messages $U_1, U_2, \ldots, U_{d_{cn}}$ which may be arranged in a set denoted by $UIN=(U_1, U_2, \ldots, U_{d_{cn}})$. Using the one-column vector notation of the variable node messages as in equation (1), the set UIN may be written as:

$$UIN = \left( \begin{pmatrix} U_1[n_{m,in}-1] \\ \vdots \\ U_1[1] \\ U_1[0] \end{pmatrix}, \begin{pmatrix} U_2[n_{m,in}-1] \\ \vdots \\ U_2[1] \\ U_2[0] \end{pmatrix}, \ldots, \begin{pmatrix} U_{d_{cn}}[n_{m,in}-1] \\ \vdots \\ U_{d_{cn}}[1] \\ U_{d_{cn}}[0] \end{pmatrix} \right) \quad (2)$$

The message presorting unit 24-*cn* may be configured to determine the permuted variable node messages $UP_1, UP_2, \ldots, UP_{d_{cn}}$ by applying one or more permutations to the variable node messages in the set UIN depending on the reliability metrics $U_i^+[j]$ associated with the symbols $U_i^{\oplus}[j]$. A permutation is denoted by $\pi_t$ for $t=1, \ldots, Tmax$, with Tmax designating the total number of the used permutations. A permuted variable node message $UP_i$ comprises $n_{m,in}$ components denoted by $UP_i[j]=(UP_i^{\oplus}[j], UP_i^+[j])$, each component comprising a symbol $UP_i^{\oplus}[j]$ and a reliability metrics $UP_i^+[j]$ associated with this symbol.

According to some embodiments, the message presorting unit 24-*cn* may be configured to determine a permutation index, denoted by $j_t$, in association with each permutation $\pi_t$, the permutation index taking values between 1 and $n_{m,in}$.

Given the permutation index $j_t$, a permutation $\pi_t$ may be applied to permute two or more of the variable node messages in the set UIN according to the reliability metrics of the $j_t^{th}$ variable node components $U_i[j_t]$. The permutation $\pi_t$ enables to change the order of the variable node messages in a way that the most reliable variable node components of all the received variable node messages are separated from the less reliable ones.

The message presorting unit 24-*cn* may be configured to determine the permuted variable node messages corresponding to a vector permutation $\pi_t$ by performing four steps as follows:

1) Extract, from the set of variable node messages UIN, the row-vector $P^{(t)}$ comprising the components $U_i[j_t]$ for $i=1, \ldots, d_{cn}$ such that:

$$P^{(t)}=(U_1[j_t],U_2[j_t],\ldots,U_{d_{cn}}[j_t]) \quad (3)$$

2) Determine a vector $SP^{(t)}$ by sorting the vector $P^{(t)}$ in a given order of the reliability metrics $U_i^+[j_t]$ comprised in the components $U_i[j_t]$ for $i=1, \ldots, d_{cn}$. The sorting may be performed in an increasing or decreasing order of the reliability metrics.

3) Determine, from the sorted vector $SP^{(t)}$, the permutation $\pi_t$ associated with the sorting of the vector $P^{(t)}$ such that the sorted vector $SP^{(t)}$ can be expressed as:

$$SP^{(t)}=\pi_t(P^{(t)})=(U_{\pi_t(1)}[j_t],U_{\pi_t(2)}[j_t],\ldots,U_{\pi_t(d_{cn})}[j_t]) \quad (4)$$

4) Apply the permutation $\pi_t$ to the set of variable node messages UIN to obtain the set $UP^{(t)}=(UP_1^{(t)}, UP_2^{(t)}, \ldots, UP_{d_{cn}}^{(t)})$ of permuted variable node messages such that:

$$UP^{(t)}=(UP_1^{(t)},UP_2^{(t)},\ldots,UP_{d_{cn}}^{(t)})=(U_{\pi_t(1)},U_{\pi_t(2)},\ldots,U_{\pi_t(d_{cn})}) \quad (5)$$

Using the local notation of messages at the level of the check node processing unit 25-*cn* and the indexes of the check node messages, the permutation $\pi_t$ may be seen as a permutation of the set of indexes $(1, 2, \ldots, d_{cn})$ into the set $\pi_t(1, 2, \ldots, d_{cn})=(\pi_t(1),\pi_t(2),\ldots,\pi_t(d_{cn}))$ and the permuted variable node messages satisfy $UP_i^{(t)}=U_{\pi_t(i)}$ for $i=1, 2, \ldots, d_{cn}$. Moreover, the set $(1, 2, \ldots, d_{cn})$ can be obtained from the permuted set $\pi_t(1, 2, \ldots, d_{cn})$ by applying the inverse permutation $\pi_t^{-1}$ corresponding to the inverse of the permutation $\pi_t$, such that the composition of the permutation $\pi_t^{-1}$, and the permutation $\pi_t^{-1}$ gives the identity function, i.e. $\pi_t^{-1}(\pi_t(1, 2, \ldots, d_{cn}))=(1, 2, \ldots, d_{cn})$. Similarly, the variable node messages $U_1, U_2, \ldots, U_{d_{cn}}$ can be obtained from the permuted variable node messages $UP_1^{(t)}, UP_2^{(t)}, \ldots, UP_{d_{cn}}^{(t)}$ by applying the inverse permutation $\pi_t^{-1}$ such that $\pi_t^{-1}(UP_1^{(t)}, UP_2^{(t)}, \ldots, UP_{d_{cn}}^{(t)})=(U_1, U_2, \ldots, U_{d_{cn}})$.

In order to perform the presorting of the variable node messages, the message presorting unit 24-*cn* may implement a $d_{cn}$ sorter (not illustrated in FIG. 2) dedicated to determine the sorted vector $SP^{(t)}$ for each permutation $\pi_t$ according to equation (4) and a permutation network (or switch) for performing the permutation of the set of variable node messages according to equation (5).

Further, in some embodiments in which the variable node messages are sorted according to a given order of the reliability metrics, the generated permuted variable node messages may be sorted according to said given order.

According to some embodiments, the number Tmax of the permutations $\pi_t$ may be predefined.

According to other embodiments, the message presorting unit 24 may be configured to determine the number Tmax of the permutations $\pi_t$ based on one or more of a signal-to-noise ratio, the number $n_{m,in}$ of variable node components, the degree of the check node processing unit 25-$cn$, the reliability metrics comprised in some of the variable node components, the algebraic structure of construction of the error correcting code $\mathcal{C}(n,K)$, and the number of iterations of the iterative decoding process.

For example, in one embodiment, the number Tmax of the vector permutations may be equal to one, i.e. Tmax=1 corresponding to a single permutation $\pi=\pi_1$.

In such embodiments and when the variable node messages are sorted according to equation (1), the permutation index may be advantageously equal to 1, i.e. $j_1=1$. Accordingly, the variable node messages may be permuted in a way that the components $U_1[1], U_2[1], \ldots, U_{d_{cn}}[1]$ are sorted in a given order of the reliability metrics $U_i^+[1]$ for $i=1, \ldots, d_{cn}$. In such embodiments, the message presorting unit 24-$cn$ may be configured to:

1) Extract, from the set of variable node messages UIN, the row-vector P comprising the components $U_1[1]$ for $i=1, \ldots, d_{cn}$ such that:

$$P=(U_1[1],U_2[1],\ldots,U_{d_{cn}}[1]) \quad (6)$$

2) Determine a vector SP by sorting the vector P in a given order (increasing or decreasing) of the reliability metrics $U_i^+[1]$ for $i=1, \ldots, d_{cn}$.

3) Determine, from the sorted vector SP, the permutation $\pi$ associated with the sorting of the vector P such that the sorted vector SP can be expressed as:

$$SP=\pi(P)=(U_{\pi(1)}[1],U_{\pi(2)}[1],\ldots,U_{\pi(d_{cn})}[1]) \quad (7)$$

4) Apply the permutation $\pi$ to the set of variable node messages UIN to obtain the set $UP=(UP_1,UP_2,\ldots,UP_{d_{cn}})$ of permuted variable node messages such that:

$$UP=(UP_1,UP_2),\ldots,UP_{d_{cn}})=(U_{\pi(1)},U_{\pi(2)},\ldots,U_{\pi(d_{cn})}) \quad (8)$$

Using the local notation of messages at the level of the check node processing unit 25-$cn$ and the indexes of the check node messages, the permutation $\pi$ may be seen as a permutation of the set of indexes $(1, 2, \ldots, d_{cn})$ into the set of permuted indexes $\pi(1, 2, \ldots, d_{cn})=(\pi(1), \pi(2), \ldots, \pi(d_{cn}))$.

The following description will be made with reference to the application of one permutation denoted by $\pi$, for illustration purposes only. However, the skilled person will readily understand that the invention applies to a presorting of the variable node messages using two or more permutations. In particular, in other embodiments involving Tmax≥2 permutations, the permuted variable node messages may be obtained by applying the permutation $\pi$ resulting from the composition of the permutations $\pi_1, \pi_2, \ldots, \pi_{Tmax}$ such that $\pi=\pi_1\circ\pi_2\circ\ldots\circ\pi_{Tmax}$. The composition of two or more permutations provides a permutation which can be obtained by a subsequent application of the composed permutations. Using the permutation of the set $(1, 2, \ldots, d_{cn})$, the composition of the permutations $\pi_1, \pi_2, \ldots, \pi_{Tmax}$ can be obtained according to:

$$\pi(1,2,\ldots,d_{cn})=\pi_{Tmax}(\pi_{Tmax-1}(\ldots(\pi_2(\pi_1(1,2,\ldots,d_{cn}))))) \quad (9)$$

Further, the inverse of the permutation $\pi$ will be designated by $\pi^{-1}$ and it satisfies $\pi^{-1}(\pi(i))=i$ for each index $i=1, \ldots, d_{cn}$.

The message presorting unit 24-$cn$ may be further configured to deliver the determined at least three permuted variable node messages $UP_1, UP_2, \ldots, UP_{d_{cn}}$ to the corresponding check node processing unit 25-$cn$.

The check node processing unit 25-$cn$ may be configured to generate, from the received at least three permuted variable node messages, at least one check node message by implementing a block division into at least two blocks of sub-check nodes based on a set of block division parameters determined by the block division unit 27.

The block division unit 27 may be configured to determine a set of block division parameters in association with at least one check node processing unit 25-$cn$ for $cn=1, \ldots, n-K$.

According to some embodiments, the determination of at least one set of block division parameters may be performed in an offline mode, for example before the start of the iterative decoding process or the start of the message exchanges between the variable node processing units 23-$vn$ and the check node processing units 25-$cn$.

In other embodiments, the determination of at least one set of block division parameters may be performed online, during the iterative decoding process, for example.

In some embodiments of the invention, a set of block division parameters associated with a check node processing unit 25-$cn$ may comprise at least:

a first block division parameter, denoted by $N_B$, representing the number of blocks of sub-check nodes comprised in a check node processing unit 25-$cn$. The number of blocks of sub-check nodes may be higher than or equal to two ($N_B\geq 2$) according to which a check node processing unit 25-$cn$ may be divided into at least two blocks of sub-check nodes, and at least one second block division parameter, denoted by $1^{(k)}\geq 1$ for $k=1, \ldots, N_B$, representing at least one check node message. A second block division parameter $1^{(k)}$ represents the number of the check node messages generated by the block of sub-check node of index k comprised in a check node processing unit 25-$cn$ for $cn=1, \ldots, n-K$.

According to some embodiments in which the iterative decoder 123 comprises at least two check node processing units 25-$cn$ for $cn=1, \ldots, n-K$ with n-k≥2, the block division unit 27 may be configured to determine a same set of block division parameters in association with each of the at least two check node processing units 25-$cn$. This means that the various first block division parameters associated with each of the at least two check node processing units 25-$cn$ may be equal and the various second block division parameters associated with each of the at least two check node processing units 25$cn$ may be equal.

In other embodiments in which the iterative decoder 123 comprises at least two check node processing units 25-$cn$ for $cn=1, \ldots, n-K$ with n-K≥2, the block division unit 27 may be configured to determine sets of block division parameters, each set being associated with one of the at least two check node processing units 25-$cn$ and said sets of block division parameters comprising at least one different block division parameter. In other words, the sets of block division parameters associated with at least two different check node processing units 25-$cn$ may comprise at least one different block division parameter.

According to some embodiments in which the iterative decoder 123 comprises at least two check node processing units 25-$cn$ for $cn=1, \ldots, n-K$ with n-K≥2, the block division unit 28 may be configured to divide at least one check node processing unit 25-$cn1$ into at least two blocks of sub-check nodes, at least one remaining check node processing unit 25-$cn2$ with $cn2\neq cn1$ being not divided into blocks.

In some embodiments, a block of sub-check node may be a check node processing unit, i.e. it may be configured to determine all of the check node messages.

According to some embodiments, the block division unit 27 may be configured to determine a set of block division parameters in association with at least one check node processing unit 25-cn for cn=1, . . . , n–K depending on the received permuted variable node messages that will be processed by the check node processing unit 25-cn.

For instance, in some embodiments in which the permuted variable node messages are truncated (resulting for example from a truncation of the variable node messages), the block division unit 27 may be configured to determine a set of block division parameters depending on the number $n_{m,in}$ of components comprised in the received permuted variable node messages.

In another example, the block division unit 27 may be configured to determine a set of block division parameters in association with at least one check node processing unit 25-cn for cn=1, . . . , n–K depending on the degree $d_{cn}$ of the check node processing unit 25-cn. Accordingly, the block division unit 27 may be configured to determine a number of blocks of sub-check nodes higher than or equal to two in association with check node processing units 25-cn of degrees higher than or equal to three, enabling a simplification of the computation of the check node messages both in terms of the required computational operations and latency. For example, the block division unit 27 may be configured to divide a check node processing unit 25-cn of degree $d_{cn}$=12 into four blocks of sub-check nodes, each block receiving three permuted variable node messages.

Further, according to some embodiments, the block division unit 27 may be configured to determine a set of block division parameters in association with at least one check node processing unit 25-cn depending on at least one parameter chosen in a group comprising a signal-to-noise ratio, the algebraic structure of construction of the used error correcting code $\mathcal{C}$ (n,K), and the number of iterations of the exchange of messages between the variable node processing units 23-vn and the check node processing units 25-cn.

For example, the block division unit 27 may be configured to determine a first block division parameter, i.e. the number of blocks of sub-check nodes into which a given check node processing unit 25-cn may be divided, depending on the order of the Galois Field. Decoding of signals encoded using codes constructed over high order Galois Fields may require a large number of blocks in order to divide the intensive computation of the check node messages into a per-block computation involving lower computational and storage resources.

Given the determined set of block division parameters, the processing and calculation of check node messages at the level of a check node processing unit 25cn may be performed by the divided blocks of sub-check nodes in which at least one block of sub-check node implements a syndrome-based computation and at least one block of sub-check node implements a forward-backward-based computation, enabling a significant complexity reduction.

In some embodiments, the check node messages may be truncated such that a check node message $V_i$ comprises $n_{m,out}$ check node components written in a one-column representation as:

$$V_i = \begin{pmatrix} V_i[n_{m,out}-1] \\ \vdots \\ V_i[1] \\ V_i[0] \end{pmatrix} \quad (10)$$

A check node component $V\_i[j]=(V\_i\hat{\oplus}[j], V\_i\hat{+}[j])$ for j=0, . . . , n_(m,out)–1 may comprise a symbol $V\_i\hat{}[j]$ and the reliability metrics $V\_i\hat{+}[j]$ associated with said symbol. Further, the check node messages may be sorted according to a given order (increasing or decreasing) of the reliability metrics. In particular, the check node components may be sorted in a way that the check node component comprising the most reliable symbol corresponds to the component V_i[0], for i=1, . . . , d_cn and that $V\_i\hat{+}[j+1] \geq V\_i\hat{+}[j]$ for j=0, . . . , n_(m,out)–2.

The following description of some embodiments will be made with reference to a block division of the check node processing unit 25-cn into two blocks of sub-check nodes using a set of division parameters $\{N_B=2, l^{(1)}=d_{cn}, l^{(2)} \geq 1;\}$, for illustration purposes only. However the skilled person will readily understand that the various embodiments of the invention may apply to any block division of the check node processing unit 25cn into three or more blocks of sub-check nodes. The two blocks of sub-check nodes will be designated by S-CN$^{(1)}$ and S-CN$^{(2)}$. Each block of sub-check node S-CN$^{(k)}$ for k=1, 2 may be configured to determine $l^{(k)} \geq 1$ check node messages and the two blocks implement a hybrid architecture combining a syndrome-based architecture and a forward-backward-based architecture.

Without loss of any generality and in order to facilitate the understanding of the following embodiments, the description of the following embodiments will be made with reference to an implementation of the syndrome-based architecture at the sub-check node S-CN$^{(1)}$ and an implementation of the forward-backward-based architecture at the sub-check node S-CN$^{(2)}$. This hybrid architecture is designated by mixe($l^{(1)}$, $l^{(2)}$) in which $l^{(1)}=d_{cn}$ check node messages are determined by the syndrome sub-check node S-CN$^{(1)}$ and $l^{(2)} \geq 1$ check node messages are determined by the forward-backward sub-check node S-CN$^{(2)}$.

Figure 3:
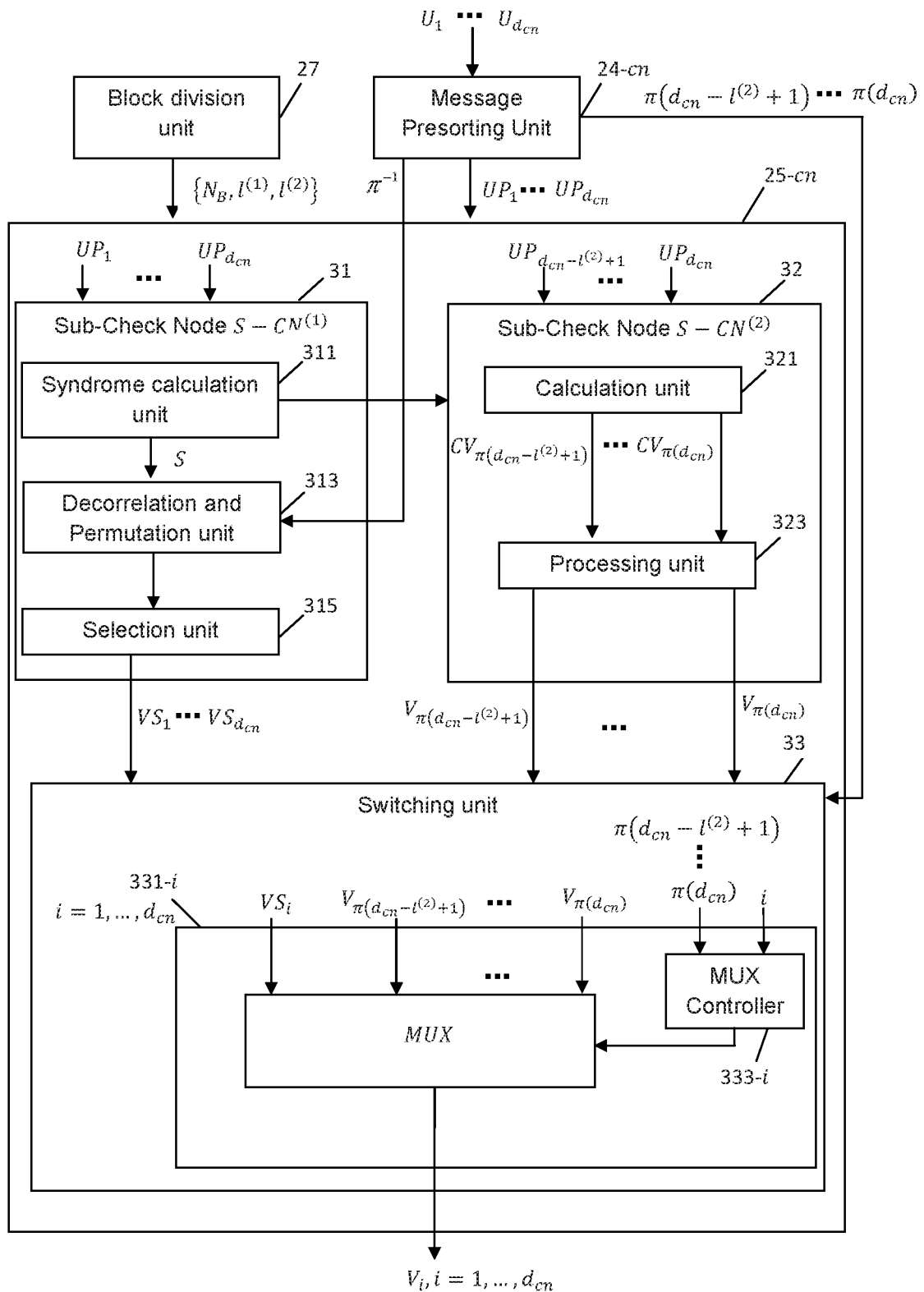
FIG. 3 is a block diagram illustrating the structure of a check node processing unit, according to some embodiments in which presorted block hybrid syndrome-based and forward-backward-based architectures are used.

FIG. 3 is a block diagram illustrating the structure of a check node processing unit 25-cn implementing a hybrid architecture mixe ($l^{(1)}=d_{cn}$, $l^{(2)} \geq 1$). Accordingly, the check node processing unit 25-cn may comprise:

a syndrome sub-check node 31 configured to:
determine at least one intermediate message from at least two permuted variable node messages and send said at least one intermediate message to the forward-backward sub-check node 32;
determine a set of S=$\{S_1, S_2, \ldots, S_{NS}\}$ of NS>1 syndromes from the intermediate message computed from all the permuted variable node messages, and
determine $l^{(1)}=d_{cn}$ check node messages $VS_1, \ldots, VS_{d_{cn}}$ from the set of syndromes S;

a forward-backward sub-check node 32 configured to determine $l^{(2)}$ permuted check node messages $V_{\pi(d_{cn}-l^{(2)}+1)}, \ldots, V_{\pi(d_{cn})}$ from at least one intermediate message received from the syndrome sub-check node 31. The determined $l^{(2)}$ permuted check node messages correspond to the check node messages of permuted indexes, the permuted indexes taking values between $\pi(d_{cn}-l^{(2)}+1)$ and $\pi(d_{cn})$;

a switching unit 33 configured to determine at least two check node messages $V_1, \ldots, V_{d_{cn}}$ from the $l_1=d_{cn}$ check node messages delivered by the syndrome sub-check node 31 and the $l^{(2)}$ permuted check node messages $V_{\pi(d_{cn}-l^{(2)}+1)}, \ldots, V_{\pi(d_{cn})}$ delivered by the forward-backward sub-check node 32. More specifically, the switching unit 33 may be configured to determine each check node message $V_i$ of a given index i with $i=1, \ldots, d_{cn}$ by:

- associating the check node message $V_i$ of given index i with the permuted check node message $V_{\pi(x)}$ generated by the forward-backward sub-check node 32 if the permuted index $\pi(x)$ (x taking values between $d_{cn}-l^{(2)}+1$ and $d_{cn}$) corresponding to the index of the permuted check node message $V_{\pi(x)}$ is equal to the index i, i.e. if $\pi(x)=i$ then $V_i=V_{\pi(x)}$;
- associating the check node message $V_i$ of index i with the check node message $VS_i$ of index i delivered by the syndrome sub-check node otherwise, i.e. $V_i=VS_i$ if there is no permuted index $\pi(x)$ that is equal to the index i, i.e. if none of the permuted check node messages $V_{\pi(x)}$ is of an index $\pi(x)$ equal to the given index i.

Referring to FIG. 3, the switching unit 33 may consist of $d_{cn}$ multiplexers $MUX_i$ 331-i for $i=1, \ldots, d_{cn}$, each multiplexer $MUX_i$ being configured to generate the check node message $V_i$ from one of the check node messages $VS_i$ received from the syndrome sub-check node 31 or one of the permuted check node messages $V_{\pi(x)}$ delivered by the forward-backward sub-check node 32 with x taking values between $d_{cn}-l^{(2)}+1$ and $d_{cn}$. Each multiplexer $MUX_i$ may comprise a multiplexer controller 333-i configured to receive the permuted indexes $\pi(x)$ for x taking values between $d_{cn}-l^{(2)}+1$ and $d_{cn}$ and to check if there is at least one permuted index $\pi(x)$ that is equal to the index i of the corresponding check node message. If the condition is satisfied, the multiplexer $MUX_i$ may activate the output on the permuted check node message $V_{\pi(x)}$ such that the check node message $V_i$ is equal to the permuted check node message, i.e. $V_i=V_{\pi(x)}$. If the condition is not satisfied, the multiplexer $MUX_i$ may activate the output on the check node message $VS_i$ such that the check node message $V_i$ is equal to this check node message, i.e. $V_i=VS_i$.

According to some embodiments, the values of the permuted indexes $\pi(d_{cn}-l^{(2)}+1), \ldots, \pi(d_{cn})$ may be passed from the message presorting unit 24-cn to the switching unit 33.

In some embodiments, the switching unit 33 may comprise $d_{cn}$ multiplexers $MUX_i$ 331-i for $i=1, \ldots, d_{cn}$ that are physically distinct from the check node processing unit 25-cn.

More specifically, the syndrome sub-check node 31 may comprise:

a syndrome calculation unit 311 configured to determine the set $S=\{s_1, s_2, \ldots, s_{NS}\}$ of $NS>1$ syndromes from the permuted variable node messages, a syndrome denoted by $S_r=(S_r^{\oplus}, S_r^+, S_r^{DBV})$ for $r=1, \ldots, NS$ comprising a GF(q) symbol $S_r^{\oplus}$, the reliability metrics $S_r^+$ associated with this symbol, and a binary vector $SP_r^{DBV}$ comprising $d_{cn}$ bits, a bit denoted by $S_r^{DBV}[i]$ being associated with the $i^{th}$ check node message $V_i$, for $i=1, \ldots, d_{cn}$;

a decorrelation and permutation unit 311 configured to determine, from the set of syndromes S, a candidate check node message $CV_i$ in association with each check node message $V_i$ for $i=1, \ldots, l^{(1)}$, the candidate check node message comprising at least one candidate check node component $CV_i[z]=(CV_i^{\oplus}[z],CV_i^+[z])$ determined depending on the binary vectors $S_r^{DBV}$ comprised in the set of syndromes S. More specifically, the candidate check node components $CV_i[z]$ may be determined by selecting, among the syndromes $S_r$, with $r=1, \ldots, NS$, the syndromes which comprise binary vectors $S_r^{DBV}$ such that the bit $S_r^{DBV}[\pi^{-1}(i)]$ associated with the check node message $V_i$ is equal to a given value. Accordingly, the decorrelation and permutation unit 313 may be configured for each check node message $V_i$ of index i, to:

Determine a permuted index $\pi^{-1}(i)$ by applying the inverse of the permutation $\pi$ to the integer index i;

Select at least one valid syndrome $S_r$, in the set of syndromes S, a valid syndrome comprising a binary value $S_r^{DBV}[\pi^{-1}(i)]$ associated with the permuted index $\pi^{-1}(i)$ equal to a given value, and Determine the at least one check node component $CV_i[z]$ from the at least one valid syndrome. More specifically, the decorrelation and permutation unit 313 may be configured to determine the symbol $CV_i^{\oplus}[z]$ and the reliability metrics $CV_i^+[z]$ comprised in at least one candidate check node message $CV_i[z]$ for $i=1, \ldots d_{cn}$, respectively from the symbols $S_r^{\oplus}$ and the reliability metrics $S_r^+$ comprised in the selected syndromes;

a selection unit 315 configured to determine at least one check node message $VS_i$ for $i=1, \ldots, d_{cn}$ by selecting, from the corresponding candidate check node message $CV_i$, $n_{m,out} \geq 1$ components depending on the reliability metrics $CV_i^+[z]$ comprised in said candidate check node messages.

According to some embodiments, the syndrome calculation unit 311 may be configured to determine the symbols $S_r^{\oplus}$ comprised in the syndromes $S_r$ for $r=1, \ldots, NS$ from the symbols comprised in the components of the permuted variable node messages according to:

$$S_r^{\oplus} = S_r^{\oplus}(u_1, u_2, \ldots, u_{dj}) = UP_1^{\oplus}[u_1] \oplus UP_2^{\oplus}[u_2] \oplus \ldots \oplus UP_{d_{cn}-1}^{\oplus}[u_{d_{cn}-1}] \oplus UP_{d_{cn}-1}^{\oplus}[u_{d_{cn}}] \oplus \quad (11)$$

In equation (11), each index $u_1$ for $i=1, \ldots, d_{cn}$ varies in the set $\{0, 1, \ldots, n_{m,in}-1\}$ and the operator $\oplus$ designates the addition operator over the algebraic structure of construction of the code in general, and over the Galois field, in particular.

Moreover, the syndrome calculation unit 311 may be configured to determine the reliability metrics $S_r^+$ comprised in the syndromes $S_r$ for $r=1, \ldots, NS$ from the reliability metrics comprised in the components of the permuted variable node messages according to:

$$S_r^+ = S_r^+(u_1, u_2, \ldots, u_{dj}) = UP_1^+[u_1] + UP_2^+[u_2] + \ldots + UP_{d_{cn}-1}^+[u_{d_{cn}-1}] + UP_{d_{cn}-1}^+[u_{d_{cn}}] + \quad (12)$$

The addition operation of equation (12) may be performed over a given algebraic structure which may be chosen in a group comprising the field $\mathbb{R}$ of real numbers, the field $\mathbb{Z}$ of integer numbers, and the field $\mathbb{N}$ of natural numbers. For example in quantized hardware implementations and/or software implementations, the addition operation may be advantageously performed over the integer field $\mathbb{Z}$ or the field of natural numbers $\mathbb{N}$, enabling a computational complexity reduction.

Further, the syndrome calculation unit 311 may be configured to determine the binary vectors $S_r^{DBV}$ comprised in the syndromes $S_r$ for $r=1, \ldots, NS$ by determining initial binary values in association with each of the components of the permuted variable node messages.

Accordingly, the syndrome calculation unit 311 may be configured to determine an initial binary value in association with the components $UP_i[j]$ of the permuted variable node messages $UP_i$, for $i=1, \ldots, d_{cn}$, depending on the reliability metrics $UP_i^+[j]$ associated with the symbols $UP_i^{\oplus}[j]$ comprised in said components. In particular, the syndrome calculation unit 311 may be configured to determine an initial binary value equal to a predefined first value in association with the component comprising the most reliable symbol and an initial binary value equal to a predefined second value in association with the remaining components.

Accordingly, in some embodiments in which the permuted variable node messages are sorted in such a way that the most reliable component is $UP_i[0]$ for $i=1, \ldots, d_{cn}$, the syndrome calculation unit 311 may be configured to determine an initial binary value equal to a predefined first value in association with the component $UP_i[0]$ and a predefined second value in association with the remaining components $UP_i[j]$, $j=1, \ldots, n_{m,in}$.

According to some embodiments, the predefined first value may be equal to zero ('0') and the predefined second value may be equal to one ('1'). In such embodiments, the binary value associated with a component $UP_i[j]$ comprised in a permuted variable node message, denoted by $UP_i^{DBV}[j]$, may be given by:

$$UP_i^{DBV}[j] = \begin{cases} 1 & \text{if } j \neq 0 \\ 0 & \text{if } j = 0 \end{cases} \quad (13)$$

According to other embodiments, the predefined first value may be equal to one ('1') and the predefined second value may be equal to one ('0'). Accordingly, the initial binary value associated with a component $UP_i[j]$ comprised in a permuted variable node message maybe given by:

$$UP_i^{DBV}[j] = \begin{cases} 0 & \text{if } j \neq 0 \\ 1 & \text{if } j = 0 \end{cases} \quad (14)$$

Given the determined initial binary values, the syndrome calculation unit 311 may be configured to determine the binary vector $S_r^{DBV}$ comprised in each syndrome $S_r$ as a function of the initial binary values according to:

$$S_r^{DBV} = S_r^{DVB}(u_1, u_2, \ldots, u_{d_j}) = (UP_1^{DBV}[u_1] \| \ldots \| UP_{d_{cn}}^{DBV}[u_{d_{cn}}]) \quad (15)$$

In equation (15), the operator II stands for the concatenation operation which provides, from two or more input scalars or vectors, a list in the form of a vector, the elements of the list being equal to the concatenated inputs.

It should be noted that the indices $u_1$ in equations (11), (12), and (15), vary in the set $\{0, 1, \ldots, n_{m,in}-1\}$. More specifically, thanks to the presorting of the variable node messages, the indices $u_i$ may vary in a subset of indices among the set $\{0, 1, \ldots, n_{m,in}-1\}$, the subset of indices corresponding to the component of the permuted variable node messages comprising the most reliable symbols. The presorting of the variable node messages before being processed by the syndrome sub-check node enables thus a significant reduction on the number NS of syndromes which need to be computed in order to generate the check node components and enables advantageously the generation of the syndromes which comprise the most reliable symbols.

According to some embodiments, the syndrome calculation unit 311 may be configured to sort the syndromes $S_r$ for $r=1, \ldots, NS$ according to a given order of the reliability metrics $S_r t$ comprised in said syndromes.

According to some embodiments, the number of syndromes NS may be greater than or equal to the number of components $n_{m,in}$ comprised in the permuted variable node messages and/or may depend on the order of the Galois Field.

For example, in GF(64), the number of syndromes may be given by $NS=3n_{m,out}=10n_{m,in}$, the number of components comprised in each check node message being typically $n_{m,out}=20$.

In another example considering GF(256), the number of syndromes may be given by $NS=3n_{m,out}=20n_{m,in}$, the number of check node components comprised in each check node message being typically $n_{m,out}=60$.

Still in another example for GF(1024), the number of syndromes may be given by $NS=3n_{m,out}=45n_{m,in}$, the number of check node components comprised in each check node message being typically $n_{m,out}=150$.

According to some embodiments, the syndrome calculation unit 311 may be configured to determine the set of syndromes S using at least one elementary check node processor, enabling further a reduction of the complexity involved in the computation of the syndromes. Indeed, the use of elementary check node processors for the computation of syndromes advantageously enables to take advantage of the linear complexity of the elementary computations performed by the elementary check node processors as well as of the parallelism of syndrome-based decoding. Moreover, elementary check node processors provide sorted syndromes. As a result, the sorting operation conventionally applied after syndrome calculation can be removed, thereby enabling a reduction of the computational complexity required for the sorting process as well as a reduction of the implementation costs.

The elementary check node processors may be implemented according to various architectures. For illustration purposes and without limitation, some embodiments will be detailed in the following for the 'Bubble-syndrome' architecture. However, the skilled person will readily understand that the invention may be applied to any architecture involving a computation of syndromes such as the T-EMS algorithm.

Figure 4:
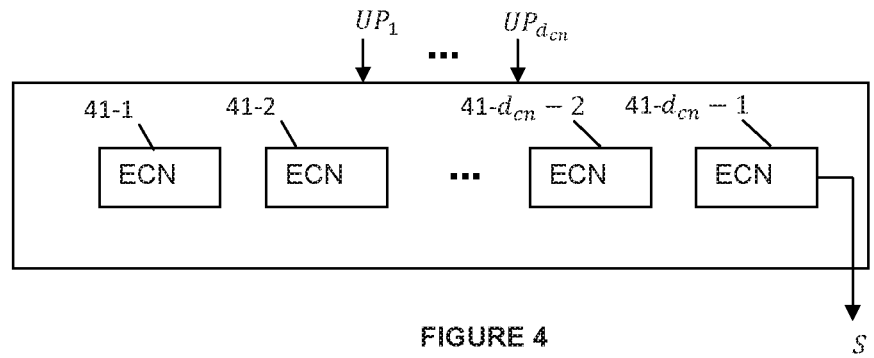
FIG. 4 is a block diagram illustrating the structure of a syndrome calculation unit, according to some embodiments in which a plurality of elementary check node processors are used.

FIG. 4 is a block diagram illustrating a structure of a syndrome calculation unit 311 according to some embodiments in which a Bubble-Syndrome architecture is used. Accordingly, the syndrome calculation unit 26 of the check node processing unit 25-cn of degree $d_{cn}$ may comprise $d_{cn}-1$ elementary check node processors 41 (also referred to as 41-d for $d=1, \ldots, d_{cn}-1$).

Accordingly, the syndrome calculation unit 311 may comprise at least one elementary check node processors 41. Each elementary check node processor 41 may be configured to determine an intermediate message from a first message and a second message, the first message and the second message being derived from the permuted variable node messages $UP_1, UP_2, \ldots, UP_{d_{cn}}$. An intermediate message may comprise:

at least one intermediate component, comprising a symbol and a reliability metrics associated with said symbol, and an intermediate binary vector associated with said intermediate component.

Using such an implementation, the syndrome calculation unit 311 may comprise an elementary check node processor 41-$d_{cn}$-1 configured to determine the set of syndromes from its intermediate message derived from all the permuted variable node messages.

According to some embodiments, an intermediate message $W_t'$, may comprise a number $n_t \geq 1$ of intermediate components and an intermediate binary vector associated with each intermediate component. The intermediate components may be sorted according to a given order of the reliability metrics of the symbols comprised therein.

In some embodiments, each elementary check node processor 41 may be configured to determine the symbol comprised in an intermediate component of an intermediate message by applying an addition operation over the Galois Field (in general over the structure over which the error correcting code is constructed), said addition operation being applied to the symbol comprised in a component of the first message and to the symbol comprised in a component of the second message.

Moreover, each elementary check node processor 41 may be configured to determine the reliability metrics associated with a symbol comprised in an intermediate component of an intermediate message by applying an addition operation over a given algebraic structure to the reliability metrics comprised in a component of the first message and the reliability metrics comprised in a component of the second message.

Further, each component of the first message and the second message processed by a given elementary check node processor 41 may be associated with a binary vector derived from the initial binary values. In such embodiments, each elementary check node processor 41 may be configured to determine the intermediate binary vector associated with an intermediate component by applying a vector concatenation operation, the vector concatenation operation being applied to the binary vector associated with a component of the first message and to the binary vector associated with a component of the second message.

According to some embodiments, an elementary check node processor 41 may be configured to determine an intermediate message by processing a number of components lower than or equal to $n_{m,in}$ from the first message and/or a number of components lower than or equal to $n_{m,in}$ from the second message.

The syndrome calculation unit 311 may comprise at least one elementary check node processor 41 configured to determine an intermediate message and an intermediate binary vector associated with each component of the intermediate message from two permuted variable node messages, the first and second messages being equal to a first permuted variable node message and a second permuted variable node message, respectively.

According to some embodiments in which the first message and second message are different from the permuted variable node messages, i.e. correspond to intermediate messages delivered by previous elementary check node processors 41 in the architecture, the number of components processed from the first message and/or the number of components processed from the second message may correspond to the number of components previously delivered by an elementary check node processor 41. In other words, the number of components processed by a given elementary check node processor 41 may depend on the number of components comprised in the previous intermediate messages processed by the elementary check node processors 41 located at previous stages in the architecture.

In order to illustrate the computation of an intermediate message by an elementary check node processor 41, the following description of some embodiments will be made with reference to a processing of a first and a second message both equal to a permuted variable node message.

Accordingly, an elementary check node processor 41 may be configured to process a first permuted variable node message $UP_l$ and a second permuted variable node message $UP_p$ for l and p≠l varying in the set of indices from 1 to $d_{cn}$. The first permuted variable node message may comprise $n_l=n_{m,in}$ components of a symbol and its reliability metrics and the second permuted variable node message may comprise $n_p=n_{m,in}$ components. The elementary check node processor 41 may be configured to determine an intermediate message $W'_t=W'_t(UP_p, UP_l)$ comprising $n_t\geq 1$ intermediate components $W'_t[j]=(W'^\oplus_t[j], W'^+_t[j])$ and to determine an intermediate binary vector denoted $W'^{DBV}_t[j]$ in association with each intermediate component $W'_t[j]$. The intermediate components comprised in an intermediate message may be sorted according to a given order depending on the reliability metrics of the symbols comprised therein such that $W'^+_t[j+1]\geq W'^+_t[j]$ for all j=0, . . . , $n_t$−2.

According to some embodiments, the elementary check node processor 41 may be configured to determine the intermediate message $W'_t(UP_p, UP_l)$ according to the following three steps.

At a first step, the elementary check node processor 41 may be configured to determine a set of auxiliary components from the components of the first message $UP_l$ and the components of the second message $UP_p$. An auxiliary component is referred to as a "Bubble". A Bubble denoted by $B_t[u][v]$ refers to the component obtained from the component $UP_l[u]$ comprised in the first message $UP_l$ and the component $UP_p[v]$ comprised in the second message $UP_p$. The index u varies in 0, 1, . . . , $n_l$−1 and the index v varies in 0, 1, . . . , $b_p$−1. A Bubble $B_t[u][v]=(B_t^\oplus[u][v], B_t^+B[u][v])$ is a component which may comprise:

a symbol denoted by $B_t^\oplus B[u][v]$, and the reliability metrics of the symbol denoted by $B_t^+B[u][v]$;

In addition, a binary vector denoted by $B_t^{DBV}[u][v]$ may be associated with the Bubble $B_t[u][v]$.

The total number of considered Bubbles, denoted by $NB_t$, varies between $n_t$ and $n_l \times n_p$, i.e. may be higher than or equal to $n_t$ and lower than or equal to $n_l \times n_p$ representing the total number of Bubbles.

According to some embodiments, the elementary check node processor 41 may be configured to determine the symbol $B_t^\oplus[u][v]$ of an auxiliary component $B_t[u][v]$ by applying an addition operation over the algebraic structure of construction of the error correcting code. For codes constructed over Galois fields, the addition operation may be performed over the Galois Field GF(q). The addition operation is applied to the symbol $UP_l^\oplus[u]$ comprised in the component $UP_l[u]$ of the first message $UP_l$ and to the symbol $UP_p^\oplus[v]$ comprised in the component $UP_p[v]$ of the second message $UP_p$ such that:

$$B_t^\oplus[u][v]=UP_l^\oplus[u]\oplus UP_p^\oplus[v] \qquad (16)$$

According to some embodiments, the elementary check node processor 41 may be configured to determine the reliability metrics $B_t^+[u][v]$ of an auxiliary component $B_t[u][v]$, by applying an addition operation over a given algebraic structure, to the reliability metrics $UP_l^+[u]$ comprised in the component $UP_l[u]$ of the first message $UP_l$ and to the reliability metrics $UP_p^+[v]$ comprised in the component $UP_p[v]$ of the second message $UP_p$ such that:

$$B_t^+[u][v]=UP_l^+[u]+UP_p^+[v] \qquad (17)$$

According to some embodiments, the elementary check node processor 41 may be configured to determine the binary vector $B_t^{DBV}[u][v]$ in association with the auxiliary component $B_t[u][v]$ by applying a vector concatenation operation. The vector concatenation operation may be applied to the binary vector $UP_l^{DBV}[u]$ associated with the component $UP_l[u]$ of the first message $UP_l$ and to the binary vector $UP_p^{DBV}[v]$ associated with the component $UP_p[v]$ of the second message $UP_p$ such that:

$$B_t^{DBV}[u][v]=(UP_l^{DBV}[u]\|UP_p^{DBV}[v]) \qquad (18)$$

At a second step, the elementary check node processor 41 may be configured to sort the determined auxiliary components (Bubbles) according to a given order of the reliability metrics of the symbols comprised in these components.

At a third step, the elementary check node processor 41 may be configured to select, among the sorted auxiliary components, the $n_t$ components comprising the most reliable symbols, which provides the intermediate message $W_t'$ and the binary vector associated with each component of the $n_t$ components comprised in this intermediate message.

Further, the number $n_t$ of components comprised in an intermediate message may be lower than the number of Bubbles.

Since the syndromes $S_r$ in the set $S$ are determined from the intermediate message generated from all the permuted variable node messages and the check node components of at least one check node message are derived from at least some of the syndromes $S_r$, at least some of the selected Bubbles at each check node processor 41 may contribute to the generation of the check node components. In order to further reduce the computational complexity and avoid the computation of Bubbles that may not contribute to the determination of the check node messages, the syndrome calculation unit 311 may comprise at least one elementary check node processor 41 configured to determine the intermediate components of an intermediate message by performing a statistical pruning on the Bubbles. The statistical pruning may be based on a post-processing statistical analysis of the Bubbles that contributed, during a previous decoding iteration or a previous decoding process of a received sequence, to the computation of check node messages. The statistical analysis aims at identifying which Bubbles can be potentially used/selected and which ones can be discarded without a performance loss, enabling to optimize the number of components $n_t$ and the number of potential Bubbles $NB_t$ to be kept at a given elementary check node processor 41.

In such embodiments, the syndrome calculation unit 311 may comprise at least one elementary check node processor 41 configured to associate a counter (also referred to as 'score'), denoted by $\gamma(B_t[u][v])$, with each Bubble $B_t[u][v]$, for a given signal-to-noise ratio and/or a given error correcting code. The at least one elementary check node processor 41 may be configured to set an initial value to the counter $\gamma(B_t[u][v])$ at the beginning of the decoding process. Each time the Bubble $B_t[u][v]$ is used for the computation of a check node message, the at least one elementary check node processor 41 may be configured to increment the counter such that:

$$\gamma(B_t[u][v]) = \gamma(B_t[u][v]) + 1 \quad (19)$$

The at least one elementary check node processor 41 may be further configured to determine a set of sorted Bubbles by sorting the $NB_t$ potential Bubbles according to an increasing order of their associated scores. Each Bubble $B_t[u][v]$ in the set of sorted potential Bubbles may be associated with an index denoted by $b_t(u,v)$ such that the associated counters with each two Bubbles $B_t[u][v]$ and $B_t[u'][v']$ of indices $b_t(u,v)$ and $b_t(u',v')$ satisfying $b_t(u,v) \leq b_t(u',v')$ fulfill $\gamma(B_t[u][v]) \leq \gamma(B_t[u'][v'])$. The indices associated with the sorted Bubbles may be arranged in a set of indices denoted by $I_t$. Given the scores of the considered $NB_t$ potential Bubbles, the at least one elementary check node processor 41 may be configured to select the $n_t$ Bubbles associated with the highest scores by discarding the $NB_t - n_c$ Bubbles associated with the lowest scores and with the first $g$ indices such that:

$$g = \operatorname{argmax}_{g \in I_t} \{\Sigma_{b_t(u,v)=0}^{g} \gamma(B_t[u][v]) \leq \tau \Gamma\} \quad (20)$$

In equation (20), $z$ designates a real number comprised between zero ('0') and one ('1') and $\Gamma = \Sigma_{b_t(u,v)=0} \gamma(B_t[u][v])$ designates the cumulative scores of the $NB_C$ potential Bubbles.

Optionally, the number $n_s$ of selected Bubbles may be any number between $n_t$ and $NB_t$, so that the $NB_t - n_s$ Bubbles associated with the lowest scores at this cut-off value are discarded. The choice of $n_s$ may be driven by considerations of an adequate compromise between computational constraints and the decoding performance of the decoding system as a whole.

Due at least in part to the statistical pruning, the operations performed by at least one of the elementary check node processing units 41 may be simplified thus enabling high speed implementations with reduced complexity while offering optimal error decoding performance.

Accordingly, in some embodiments, the syndrome calculation unit 311 of a syndrome sub-check node 31 may comprise at least one elementary check node processor 41 configured to determine an intermediate message from a first message $UP_l$ comprising two or more components (i.e. $n_l \geq 2$) and a second message $UP_p$ comprising one component (i.e. $n_p = 1$), the determined intermediate message $W_t'(UP_p, UP_l)$ comprising at least two intermediate components (i.e. $n_t \geq 2$). Such elementary check node processors 41 are referred to as 'S–1B'. Further, in embodiments in which two or more S–1B elementary check node processors operate serially, these S–1B units may be merged to operate in a single clock cycle, thus enabling a further simplification of the required hardware resources.

In some embodiments, the syndrome calculation unit 311 of a syndrome sub-check node 31 may comprise at least one elementary check node processor 41 configured to determine an intermediate message from a first message $UP_l$ comprising two or more components (i.e. $n_l \geq 2$) and a second message $UP_p$, comprising two components (i.e. $n_p = 2$), the determined intermediate message $W_t'(UP_p, UP_l)$ comprising at least three intermediate components (i.e. $n_t \geq 3$). Such elementary check node processors 41 are referred to as 'S–1B+1'.

Further, in some embodiments, the syndrome calculation unit 311 of a syndrome sub-check node 31 may comprise at least one elementary check node processor 41 configured to determine an intermediate message from a first message $UP_l$ comprising one component (i.e. $n_l = 1$) and a second message $UP_p$ comprising one component (i.e. $n_p = 1$), the determined intermediate message $W_t'(UP_p, UP_l)$ comprising one intermediate component (i.e. $n_t = 1$). Such elementary check node processors 41 are referred to as '1B'.

According to some embodiments, the elementary check node processors may be implemented in a serial architecture.

Figure 5:
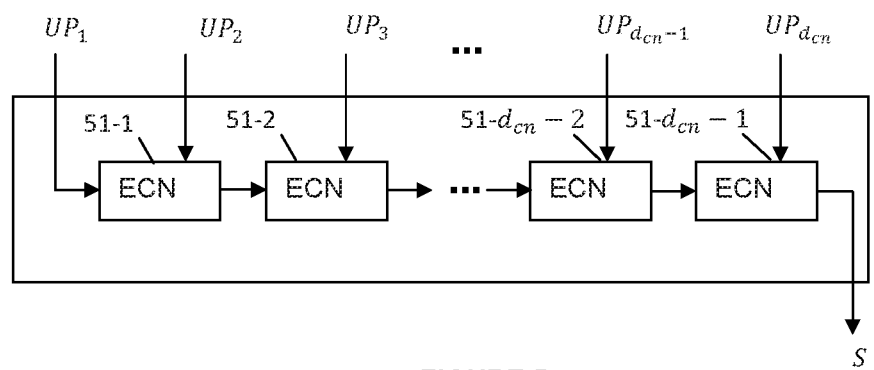
FIG. 5 is a bloc diagram illustrating the structure of a syndrome calculation unit, according to some embodiments in which a serial implementation of elementary check node processors is considered.

FIG. 5 shows a structure of a syndrome calculation unit 311 comprising $d_{cn} - 1$ elementary check node processors 51-$l$ for $l = 1, \ldots, d_{cn} - 1$ implemented in a serial architecture. In particular, the syndrome calculation unit 311 may comprise an elementary check node processor 51-1 configured to determine an intermediate message and the associated intermediate binary vector with each component of the intermediate message by processing two permuted variable node messages $UP_1$ and $UP_2$. The remaining elementary check node processors 51-$l$ for $l = 2, \ldots, d_{cn} - 1$ may be each configured to process one permuted variable node message and one intermediate message previously determined by an elementary check node processor 51-$a$ for $a = 1, \ldots, l-1$ operating at a previous stage in the serial architecture.

In embodiments using a serial architecture of the elementary check node processors as illustrated in FIG. 5, the set of syndromes S may be determined from the intermediate message delivered by the elementary check node processor 51-$d_{cn}$-1.

According to some other embodiments, the elementary check node processors may be implemented in a tree architecture. In such embodiments, the syndrome calculation unit 311 may comprise at least one elementary check node processor 41 configured to determine an intermediate message and the intermediate binary vector associated with each component of the intermediate message by processing two permuted variable node messages. The remaining elementary check node processors 41 may be configured to determine an intermediate message and the intermediate binary vector associated with each component of the intermediate message either by processing two permuted variable node messages or by processing two intermediate messages previously determined by two elementary check node processors 41 operating at previous stages of the tree architecture.

Figure 6:
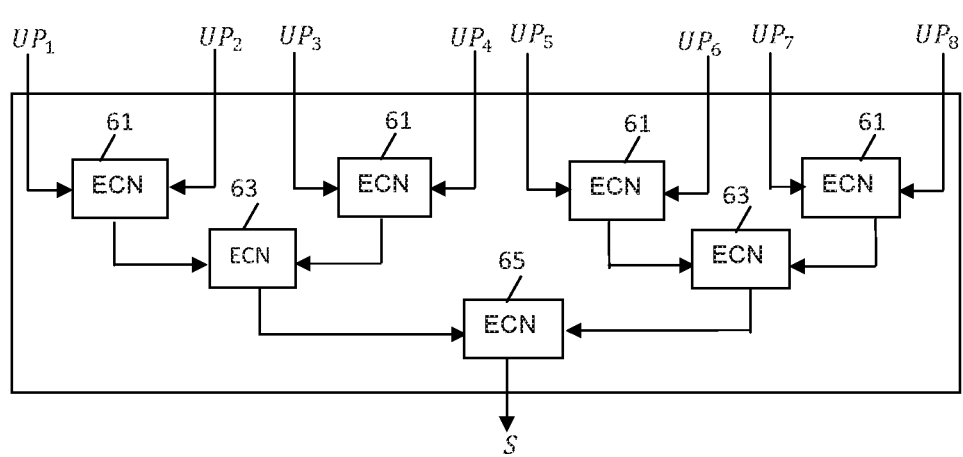
FIG. 6 is a bloc diagram illustrating the structure of a syndrome calculation unit, according to some embodiments in which a tree implementation of elementary check node processors is considered.

FIG. 6 shows a structure of a syndrome calculation unit 311 of a syndrome sub-check node of degree $d_{cn}$=8 implementing $d_{cn}$-1=7 elementary check node processors in a tree architecture. As shown, the tree architecture may comprise 3 stages (hereinafter referred to as 'layers'). The elementary check node processors 61 comprised in the first layer may be configured each to determine an intermediate message by processing two permuted variable node messages. The elementary check node processors 63 comprised at the second layer may be each configured to determine an intermediate message by processing two intermediate messages delivered by the elementary check node processors 61 located in the first layer of the architecture. The elementary check node processors 65 comprised in the third layer may be each configured to determine an intermediate message by processing two intermediate messages delivered by the elementary check node processors 63 located in the second layer of the tree architecture.

In embodiments using a tree architecture, as exemplified in FIG. 6, the set of syndromes may be determined from the intermediate message delivered by the elementary check node processor 65 located at the last stage of the tree architecture.

Figure 7:
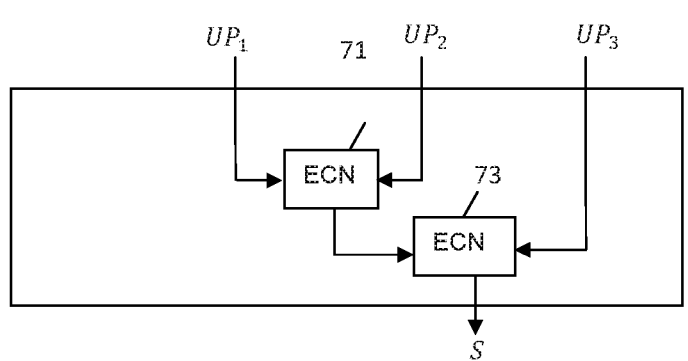
FIG. 7 is a block diagram illustrating the structure of a syndrome calculation unit, according to some embodiments in which a hybrid implementation of elementary check node processors is considered.

According to some other embodiments, the syndrome calculation unit 311 may comprise $d_{cn}$-1 elementary check node processors implemented in a hybrid architecture mixing the serial and the tree architectures as depicted for example in FIG. 7. In such embodiments, the syndrome calculation unit 311 may comprise:

at least one elementary check node processor 71 configured to determine an intermediate message and the intermediate binary vector associated with each component of the intermediate message by processing two permuted variable node messages, and at least one elementary check node processor 73 configured to determine an intermediate message and the intermediate binary vector associated with each component of the intermediate message by processing a permuted variable node message and an intermediate message generated by the elementary check node processors 71 located at a previous stage of the hybrid architecture.

In embodiments using a hybrid architecture, as exemplified in FIG. 7, the set of syndromes may be determined from the intermediate message delivered by the elementary check node processor 73 located at the last stage of the hybrid architecture.

According to an embodiment, the decorrelation and permutation unit 313 may be configured to determine the candidate check node components $CV_i[j]$ in association with each check node message $V_i$ for i=1, ..., $d_{cn}$ by selecting, among the determined set of syndromes S, the valid syndromes comprising binary vectors $S_r^{DBV}=(S_r^{DBV}[1]\|S_r^{DBV}[2], \ldots \|S_r^{DBV}[d_{cn}])$ such that the bit $S_r^{DBV}[\pi^{-1}(i)]$ associated with the permuted index $\pi^{-1}(i)$ corresponding to the check node message $V_i$ is equal to zero ('0'), the given value being accordingly equal to zero.

According to another embodiment, the decorrelation and permutation unit 313 may be configured to determine a set of candidate check node components $CV_i[j]$ in association with each check node message $V_i$ for i=1, ..., $d_{cn}$ by selecting, among the determined set of syndromes the valid syndromes comprising binary vectors $S_r^{DBV}=(S_r^{DBV}[1]\|S_r^{DBV}[2], \ldots \|S_r^{DBV}[d_{cn}])$ such that the bit $S_r^{DBV}[\pi^{-1}(i)]$ associated with the permuted index $\pi^{-1}(i)$ corresponding to the check node message $V_i$ is equal to one ('1'), the given value being accordingly equal to one.

The binary vectors DBVs may be accordingly used to indicate for which output edge a syndrome should be discarded and therefore not selected by the decorrelation and permutation unit 313. A reading of the bit in the binary vector comprised in a syndrome may be used to validate or not validate the selection of the syndrome so as to determine the candidate check node components of each candidate check node message. The candidate check node components may accordingly correspond to the components comprised in the valid syndromes and the number candidate check node components being equal to the number of selected valid syndromes NV $S_i$.

The syndromes selected to determine the candidate check node components $CV_i[j]$ of a candidate check node message $CV_i$ for i=1, ..., $d_{cn}$ may comprise $NVS_i \leq NS$ valid syndromes, denoted by VSynd[z] for z=0, ..., $NVS_i$-1. A valid syndrome VSynd[z]=(VSynd$^\oplus$[z],VSynd$^+$[z],VS$^{DBV}$[z]) comprises a symbol VSynd$^\oplus$[z] and the reliability metrics VSynd$^+$[z] associated with the symbol. The valid syndromes may be sorted according to an order (increasing or decreasing) of the reliability metrics VSynd$^\oplus$[z] such that the valid symbol comprising the most reliable symbol corresponds to VSynd[0] and that VSynd$^+$[z]≤VSynd$^+$[z+1] for z=0, ..., $NVS_i$-2.

Given the selected valid syndromes, the decorrelation and permutation unit 313 may be configured to determine the candidate check node components $CV_i[z]=(CV_i^\oplus[z], CV_i^+[z])$ for z=0, ..., $NVS_i$-1 from the values of the symbols VSynd$^\oplus$[z] and the reliability metrics VSynd$^+$[z] comprised in the selected valid syndromes. More specifically, the decorrelation and permutation unit 313 may be configured to:

determine the symbol $CV_i^\oplus[z]$ for i=1, ..., $d_{cn}$ according to:

$$CV_i^\oplus[z] = V\mathrm{Synd}^\oplus[z] \oplus U_i^\oplus[0] \qquad (21)$$

determine the reliability metrics $CV_i^+[z]$ for i=1, ..., $d_{cn}$ according to $$CV_i^+[z] = V\mathrm{Synd}^+[z] \qquad (22)$$

The selection of valid syndromes during the decorrelation process is performed in association with the check node messages $V_i$ enabling advantageously to determine, in one step, the candidate check node components associated with the underlying check node message without a need for performing a reverse operation of the permutation process performed by the message presorting unit 24. As a result, the decorrelation process enables to merge the permutation into the decorrelation, providing advantageously a reduction of the computational and storage resources required to perform the permutation.

The decorrelation and permutation unit 313 may be configured to determine the candidate check node messages from the determined set of NS syndromes S using elementary decorrelation units (not depicted in the figures). More specifically and according to some embodiments, the decorrelation and permutation unit 313 may comprise $d_{cn}$ elementary decorrelation units, each elementary decorrelation unit being associated with a check node message $V_i$ for $i=1, \ldots, d_{cn}$ and being configured to determine the candidate check node message $CV_i$ depending on the binary vectors comprised in each syndrome of the set of syndromes S.

Each elementary decorrelation unit may be accordingly configured to determine the candidate check node components $CV_i[z]=(CV_i^{\oplus}[z],CV_i^{+}[z])$ from the symbols and their reliability metrics comprised in the selected valid syndromes. More precisely, the $i^{th}$ elementary decorrelation unit associated with the check node message $V_i$ for $i=1, \ldots, d_{cn}$ may be configured to:

determine the symbol $CV_i^{\oplus}[z]$ of at least one candidate check node component from the symbols SP comprised in the selected syndromes according to equation (21), and determine the reliability metrics $CV_i^{+}[z]$ of at least one candidate check node component from the reliability metrics $S_i t$ comprised in the selected syndromes according to equation (22).

According to some embodiments, the selection unit 315 may be configured to select $n_{m,out}$ check node components comprising distinct symbols from the candidate check node components $CV_i[z]$ for $z=0, \ldots, NVS_i-1$ and $i=1, \ldots, d_{cn}$ Accordingly, the selection unit 315 may be first configured to perform a redundancy elimination in the candidate check node components $CV_i[z]$ for keeping, among the components comprising the same symbol (i.e. among the components comprising redundant symbols), the one which comprises the most reliable symbol. At a second step, the selection unit 315 may be configured to select $n_{m,out} \leq NVS_i$ components from the processed candidate check node components, depending on the reliability metrics of the symbols comprised therein such that the $n_{m,out}$ components comprising the most reliable distinct symbols are selected.

According to other embodiments, the selection unit 315 may be configured to select the $n_{m,out}$ check node components from the components of each determined candidate check node message $CV_i$ for $i=1, \ldots, d_{cn}$ by performing only the redundancy elimination on the candidate check node components. In other words, the selected $n_{m,out}$ check node components may correspond to the candidate check node components $CV_i[z]$ that comprise distinct symbols. In embodiments in which a candidate check node message $CV_i$ does not comprise components having a same symbol, the selected $n_{m,out}$ check node components may correspond to the components comprised in the selected valid syndromes, $n_{m,out}$ being in this case equal to the number of valid syndromes, i.e. $n_{m,out}=NVS_i$.

Still in other embodiments, the selection unit 315 may be configured to select $n_{m,out} \leq NVS_i$ check node components from the determined candidate check node message components $CV_i[z]$ without performing a redundancy elimination, the number $n_{m,out}$ of check node components being lower than or equal to the number $NVS_i$ of the selected valid syndromes and the selected check node components comprising symbols and their associated reliability metrics comprised in the selected valid syndromes.

It should be noted that in embodiments in which the selection unit 315 does not perform a redundancy elimination, the check node components may comprise two or more components comprising a same symbol. In such embodiments, the redundancy elimination may be performed at the level of the variable node processing units receivers of the computed check node messages.

According to some embodiments, the selection units 315 implemented in the various syndrome sub-check nodes of the divided check node processing units 25-cn for cn varying in $1, \ldots, n-K$ may be configured to select a same number $n_{m,out}$ of check node components to determine the check node messages.

According to other embodiments, the selection units 315 implemented in one or more of the syndrome sub-check nodes of one or more check node processing units 25-cn may be configured to select a different number $n_{m,out}$ of check node components to determine the check node messages. In such embodiments, the variable node processing units 23-vn which receive these check node messages may be configured to perform a truncation operation to retain a same number of components in each received check node message.

Further, according to some embodiments, the number $n_{m,out}$ of check node components may be different from the number $n_{m,in}$ of components in the permuted variable node messages, or equivalently in the variable node messages. In particular, the number of check node components may satisfy $n_{m,out} \geq n_{m,in}$.

In some embodiments, the number $n_{m,out}$ of check node components may depend on the number of components $n_{m,in}$ comprised in the permuted variable node messages.

The number $n_{m,out}$ of check node components may further depend on the error correcting code (e.g. the algebraic structure over which the code is constructed) and/or on the order of the decoding iteration of the iterative decoding process and/or on the signal-to-noise ratio and/or on the computational and storage capabilities of the check node processing units 215-cn.

In some other embodiments, the number $n_{m,out}$ of check node components may depend on a combination of the factors previously cited.

For example, for Galois Fields over GF(64), the number $n_{m,out}$ of check node components may be related to the number of components comprised in the permuted variable node messages according to $n_{m,out}=3n_{m,in}$. For Galois Fields over GF(1024), the number $n_{m,out}$ of check node components may be related to the number of components comprised in the permuted variable node messages according to $n_{m,out}=15n_{m,in}$.

Referring to FIG. 3, the check node processing unit 25-cn may further comprise a forward-backward sub-check node 32 configured to determine $l^{(2)} \geq 1$ permuted check node messages $V_{\pi(d_{cn}-l^{(2)}+1)}, \ldots, V_{\pi(d_{cn})}$ from at least one intermediate message received from the syndrome sub-check node 31. More specifically, the forward-backward sub-check node 32 may comprise:

a calculation unit 321 configured to determine, from at least one intermediate message received from the syndrome sub-check node 31 (more specifically from the syndrome calculation unit 311), a candidate permuted check node message $CV_{\pi(i)}$ in association with each check node message $V_i$ for $i=d_{cn}-l^{(2)}+1, \ldots, d_{cn}$. More specifically, the calculation unit 321 may be configured to determine a candidate permuted check node message $CV_{\pi(i)}$ associated with the check node message $V_i$ at least from the intermediate message $W_t'(UP_{l;l \neq \pi(i)})$ determined, at the syndrome calculation unit 311, from all the permuted variable node messages $UP_{l;l\neq\pi(i)}$ except the permuted variable node message $UP_i=U_{\pi(i)}$. A candidate permuted check node message $CV_{\pi(i)}$ may comprise candidate components derived at least from some of the intermediate components of the intermediate message $W_t'(UP_{l;l\neq\pi(i)})$, a candidate component comprising a symbol and a reliability metrics associated with this symbol. The candidate components may be further sorted according to a given order of the reliability metrics comprised in the intermediate components of the intermediate message $W_t'(UP_{l;l\neq\pi(i)})$.

a processing unit 323 configured to determine a permuted check node message $V_{\pi(i)}$ from each candidate permuted check node message $CV_{\pi(i)}$ by performing a redundancy elimination and/or a selection of a predefined number of components $n_{m,out}$ based on the reliability metrics comprised in the candidate components.

With reference to FIG. 3, the processing performed at the calculation unit 321 and the processing unit 323 may depend on the number $l^{(2)}$ of check node messages to be delivered by the forward-backward sub-check node 32. In order to illustrate this dependence, three hybrid architectures will be detailed in the following with references to FIGS. 8, 9 and 10.

Figure 8:
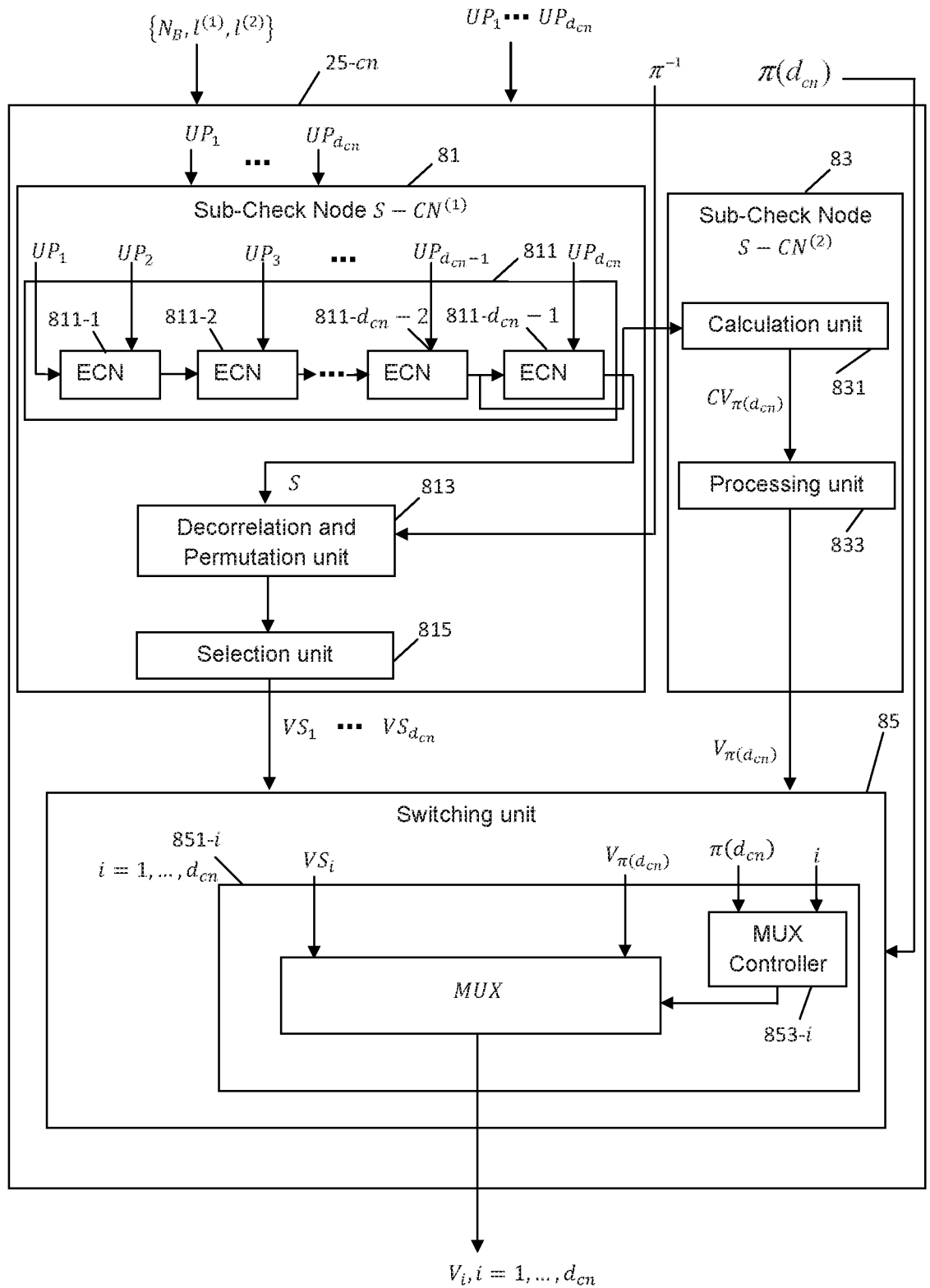
FIG. 8 is a block diagram illustrating the structure of a check node processing unit, according to some embodiments in which a division of the check node processing unit into a sub-check node implementing a syndrome-based architecture and a sub-check node implementing a forward-backward architecture is used.

FIG. 8 is a block diagram illustrating the structure of a check node processing unit 25-cn implementing a hybrid architecture mixe($l^{(1)}=d_{cn}, l^{(2)}=1$) in which a syndrome sub-check node 81 is configured to determine $d_{cn}$ check node messages $V_1, \ldots, V_{d_{cn}}$ and a forward-backward sub-check node 83 is configured to determine one permuted check node message $V_{\pi(d_{cn})}$. In addition, the syndrome calculation unit 811 implemented in the syndrome sub-check node implements $d_{cn}-1$ elementary check node processors 811-*l* for $l=1, \ldots, d_{cn}-1$ according to a serial architecture. According to such embodiments, the calculation unit 831 may be configured to receive, from the syndrome calculation unit 811, the intermediate message $W_t'(UP_1, UP_2, \ldots, UP_{d_{cn}-1})$ delivered by the elementary check node 811-$d_{cn}-2$.

As the computation of the candidate permuted check node message $CV_{\pi(d_{cn})}$ should be derived from all the permuted variable node messages except the permuted variable node message $UP_{d_{cn}}$, the calculation unit 831 may not perform additional calculation and may determine the candidate components of the candidate permuted check node message from all the components of the intermediate message i.e. $CV_{\pi(d_{cn})}=W_t'(UP_1, UP_2, \ldots, UP_{d_{cn}-1})$.

Given that redundancy elimination was not performed by the elementary check node 811-$d_{cn}-2$ for determining the intermediate message $W_t'(UP_1, UP_2, \ldots, UP_{d_{cn}-1})$, the processing unit 833 may perform, in such embodiments, redundancy elimination on the candidate components of the candidate permuted check node message $CV_{\pi(d_{cn})}$, which provides a permuted check node message $V_{\pi(d_{cn})}$ comprising components which comprise distinct symbols.

Switching unit 85 may operate as switching unit 33 of FIG. 3 and has the same variants explained in relation thereto.

Figure 9:
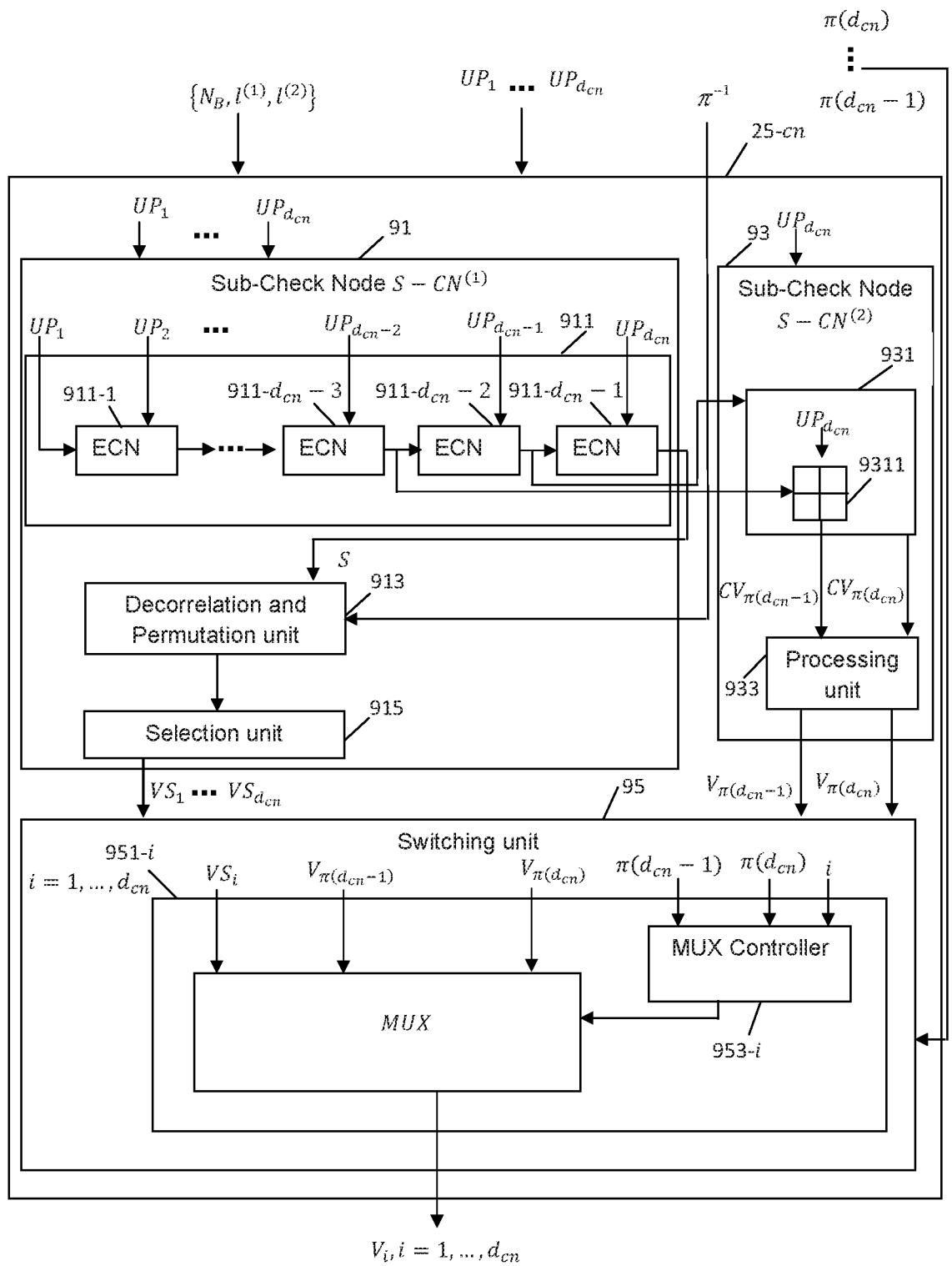
FIG. 9 is a block diagram illustrating the structure of a check node processing unit implementing a hybrid architecture, according to some embodiments.

FIG. 9 is a block diagram illustrating the structure of a check node processing unit 25-cn implementing a hybrid architecture mixe($l^{(1)}=d_{cn}, l^{(2)}=2$) in which a syndrome sub-check node 91 is configured to determine $d_{cn}$ check node messages $V_1, \ldots, V_{d_{cn}}$ and a forward-backward sub-check node 93 is configured to determine two permuted check node messages $V_{\pi(d_{cn}-1)}$ and $V_{\pi(d_{cn})}$. In addition, the syndrome calculation unit 911 implemented in the syndrome sub-check node implements $d_{cn}-1$ elementary check node processors 911-*l* for $l=1, \ldots, d_{cn}-1$ according to a serial architecture. According to such embodiments, the calculation unit 931 may be configured to receive, from the syndrome calculation unit 911, the intermediate messages $W_t'(UP_1, UP_2, \ldots, UP_{d_{cn}-2})$ and $W_t'(UP_1, UP_2, \ldots, UP_{d_{cn}-1})$ delivered respectively by the elementary check node 911-$d_{cn}-3$ and 911-$d_{cn}-2$. The calculation unit 931 may be configured to determine the candidate permuted check node message $CV_{\pi(d_{cn})}$ from the intermediate message $W_t'(UP_1, UP_2, \ldots, UP_{d_{cn}-1})$ and to determine the candidate permuted check node message $CV_{\pi(d_{cn}-1)}$ at least from the intermediate message $W_t'(UP_1, UP_2, \ldots, UP_{d_{cn}-2})$.

Similarly to the embodiment illustrated by FIG. 8, the candidate permuted check node message $CV_{\pi(d_{cn})}$ may be equal to the intermediate message delivered by the penultimate elementary check node processor in the architecture 911-$d_{cn}-2$ such that $CV_{\pi(d_{cn})}=W_t'(UP_1, UP_2, \ldots, UP_{d_{cn}-1})$.

As the computation of the candidate permuted check node message $CV_{\pi(d_{cn}-1)}$ should be derived from all the permuted variable node messages except the permuted variable node message $UP_{d_{cn}-1}$ and that the intermediate message $W_t'(UP_1, UP_2, \ldots, UP_{d_{cn}-2})$ does not comprise the contribution of the permuted variable node message $UP_{d_{cn}}$, the calculation unit 931 may be configured to perform an additional computation to take into account the components of the permuted variable node message $UP_{d_{cn}}$. Accordingly, the calculation unit 931 may comprise an elementary computation unit 9311 configured to determine the candidate permuted check node message $CV_{\pi(d_{cn}-1)}$ from the intermediate message $W_t'(UP_1, UP_2, \ldots, UP_{d_{cn}-2})$ and the permuted variable node message $UP_{d_{cn}}$. The elementary computation unit 9311 may perform the similar three steps performed by an elementary check node processor for determining an intermediate message from a first message and a second message. In addition, the elementary computation unit 9311 may perform redundancy elimination on the computed auxiliary components for retaining, among the components comprising the same symbol (i.e. among the components comprising redundant symbols), the ones which comprise the most reliable symbol.

In such embodiments, the processing unit 933 may perform redundancy elimination on the candidate components of the candidate permuted check node message $CV_{\pi(d_{cn})}$ for determining the permuted check node message $V_{\pi(d_{cn})}$ and perform only a selection of a predefined number of components from the candidate permuted check node message $CV_{\pi(d_{cn}-1)}$ for determining the permuted check node message $V_{\pi(d_{cn}-1)}$.

Switching unit 95 may operate as switching unit 33 of FIG. 3 and has the same variants explained in relation thereto.

Figure 10:
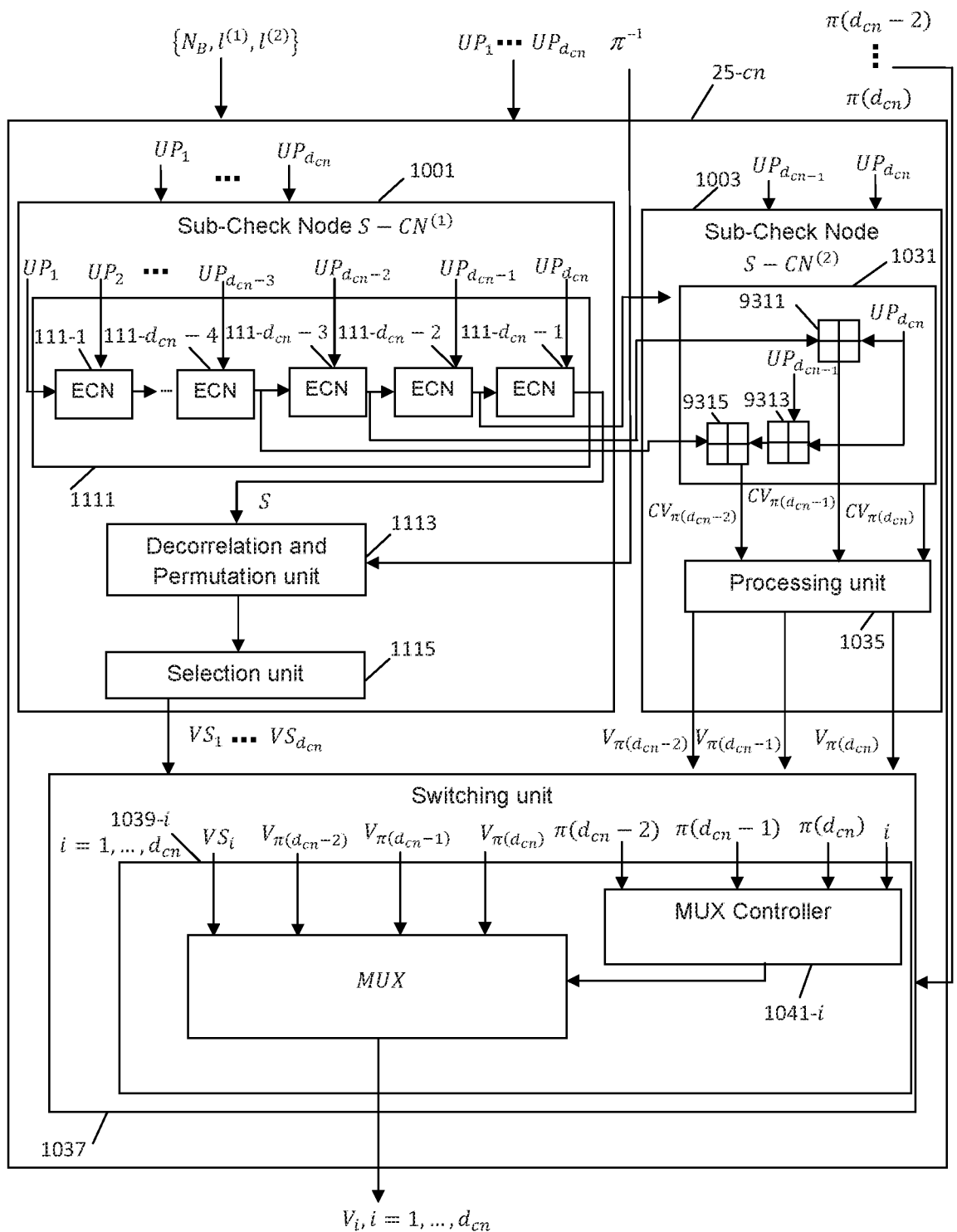
FIG. 10 is a block diagram illustrating the structure of a check node processing unit implementing a hybrid architecture, according to other embodiments.

FIG. 10 is a block diagram illustrating the structure of a check node processing unit 25-cn implementing a hybrid architecture mixe($l^{(1)}=d_{cn}, l^{(2)}=3$) in which a syndrome sub-check node 1001 is configured to determine $d_{cn}$ check node messages $V_1, \ldots, V_{d_{cn}}$ and a forward-backward sub-check node 1003 is configured to determine three permuted check node messages $V_{\pi(d_{cn}-2)}, V_{\pi(d_{cn}-1)}$, and $V_{\pi(d_{cn})}$. In addition, the syndrome calculation unit 1111 implemented in the syndrome sub-check node 1001 implements $d_{cn}-1$ elementary check node processors 111-*l* for $l=1, \ldots, d_{cn}-1$ according to a serial architecture. According to such embodiments, the calculation unit 1031 may be configured to receive, from the syndrome calculation unit 1111, the intermediate messages $W_t'(UP_1, UP_2, \ldots, UP_{d_{cn}-3}), W_t'(UP_1, UP_2, \ldots, UP_{d_{cn}-2})$ and $W_t'(UP_1, UP_2, \ldots, UP_{d_{cn}-1})$ delivered respectively by the elementary check node 911-$d_{cn}-4$, 911-$d_{cn}-3$ and 911-$d_{cn}-2$. The calculation unit 1031 may be configured to:

determine the candidate permuted check node message $CV_{\pi(d_{cn})}$ from the intermediate message $W_t'(UP_1, UP_2, \ldots, UP_{d_{cn}-1})$;

determine the candidate check node message $CV_{\pi(d_{cn}-1)}$ at least from the intermediate message $W_t'(UP_1, UP_2, \ldots, UP_{d_{cn}-2})$, and determine the candidate check node message $CV_{\pi(d_{cn}-2)}$ at least from the intermediate message $W_t'(UP_1, UP_2, \ldots, UP_{d_{cn}-2})$.

The candidate permuted check node message $CV_{\pi(d_{cn})}$ may be equal to the intermediate message delivered by the penultimate elementary check node processor in the architecture 111-$d_{cn}$-2 such that $CV_{\pi(d_{cn})} = W_t'(UP_1, UP_2, \ldots, UP_{d_{cn}-1})$.

Similarly to the embodiment illustrated in FIG. 9, the calculation unit 1031 may comprise an elementary computation unit 9311 configured to determine the candidate permuted check node message $CV_{\pi(d_{cn}-1)}$ from the intermediate message $W_t'(UP_1, UP_2, \ldots, UP_{d_{cn}-2})$ and the permuted variable node message $UP_{d_{cn}}$.

The computation of the candidate permuted check node message $CV_{\pi(d_{cn}-2)}$ should be derived from all the permuted variable node messages except the permuted variable node message $UP_{d_{cn}-2}$. However, the intermediate message $W_t'(UP_1, UP_2, \ldots, UP_{d_{cn}-3})$ does not comprise the contributions of the permuted variable node messages $UP_{d_{cn}-2}$, $UP_{d_{cn}-1}$, and $UP_{d_{cn}}$. Accordingly, the calculation unit 1031 may comprise two additional elementary computation units 9313 and 9315 such that:

the elementary computation unit 9313 is configured to determine an intermediate message from the permuted variable node messages $UP_{d_{cn}}$ and $UP_{d_{cn}-1}$, and the elementary computation unit 9315 is configured to determine the candidate permuted check node message $CV_{\pi(d_{cn}-2)}$ by processing the intermediate message $W_t'(UP_1, UP_2, \ldots, UP_{d_{cn}-3})$ and the intermediate message determined by the elementary computation unit 9313.

In some embodiments, the elementary computation units 9311, 9313 and 9315 may be configured to perform redundancy elimination for keeping, among the candidate components, the components comprising the most reliable distinct symbols.

The processing unit 1035 may be configured to:

perform a redundancy elimination and a selection on the candidate components of the candidate permuted check node message $CV_{\pi(d_{cn})}$ for determining the permuted check node message $V_{\pi(d_{cn})}$, and perform only a selection of a predefined number of components from the candidates of the permuted check node messages $CV_{\pi(d_{cn}-2)}$ and $CV_{\pi(d_{cn}-1)}$ for determining the permuted check node messages $V_{\pi(d_{cn}-2)}$ and $V_{\pi(d_{cn}-1)}$, respectively.

Switching unit 1037 may operate as switching unit 33 of FIG. 3 and has the same variants explained in relation thereto.

Figure 11:
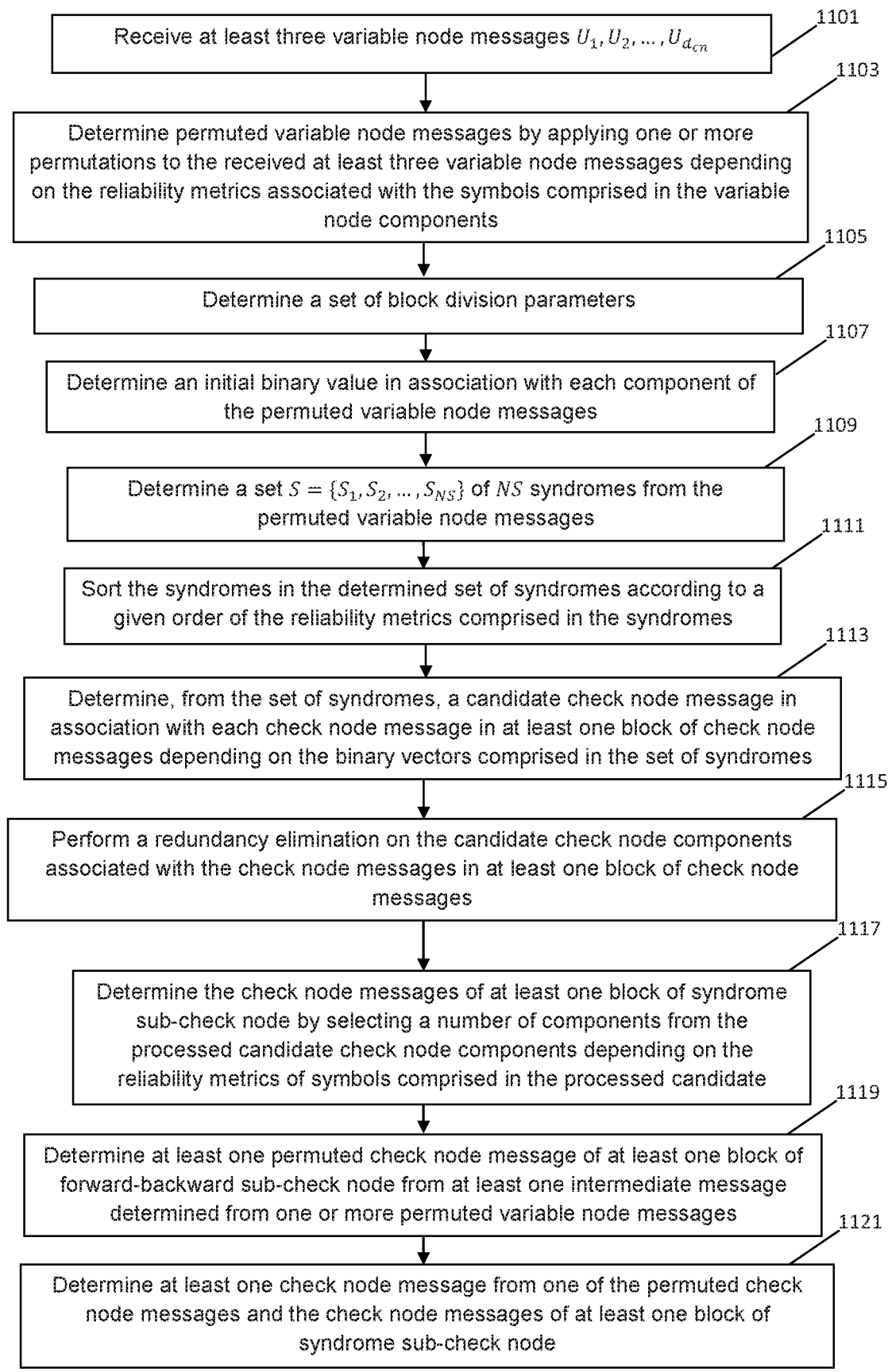
FIG. 11 is a flowchart illustrating a method of determining at least two check node messages, according to some embodiments using the EMS algorithm.

FIG. 11 is a flowchart illustrating a method of determining at least two check node messages from at least three variable node messages $U_1, U_2, \ldots, U_{d_{cn}}$ with $d_{cn} \geq 3$, implemented in the EMS algorithm for decoding non-binary LDPC codes constructed over Galois Fields according to various embodiments in which a presorting of the variable node messages is applied before block division and computation of check node messages. The presorting may be performed depending on the reliability metrics comprised in the variable node components. The computation of check node messages is performed by blocks of check node message, each block comprising at least one check node message and being computed by a block of a sub-check node. The method further comprises computing at least one block of check node messages using a syndrome-based architecture and computing at least one block of check node messages using a forward-backward architecture. The method may be implemented in any check node processing unit of degree $d_{cn} \geq 3$ used during the EMS decoding process.

The following description of some embodiments will be made with reference to reliability metrics represented in the logarithm domain by log-likelihood ratio (LLR) values, for illustration purposes only. However, the skilled person will readily understand that other types of reliability metrics may be used to measure the reliability of symbols. Moreover, sorted and truncated variable node messages, comprising each $n_{m,in}$ variable node components and check node messages, comprising each $n_{m,out}$ check node components, will be considered in the following description.

The computed check node messages are exchanged during the iterative decoding process of the EMS algorithm. The decoding process may be performed to determine an estimate ĉ of an original codeword c from a received noisy sequence represented by a vector $y=(y_1, \ldots, y_n)$ by applying the Belief Propagation decoding rule. The codeword $c=(c_1, \ldots, c_n)$ may have been encoded at the transmitter using a non-binary LDPC code $\mathcal{C}$ (n,K) constructed over the Galois Field GF(q) with q>2.

The LLR is a metrics measuring the reliability of a symbol. One definition of the LLR metrics involves a fixed reference symbol. A reference symbol of the symbol $c_i$ noted $\beta_i$ may correspond to the most reliable symbol satisfying:

$$\beta_i = \operatorname{argmax}_{t=0,\ldots,q-1} p(\alpha_t | y_i) \quad (23)$$

where, in equation (23), $\alpha_t$ designates a GF symbol.

Accordingly, for the $i^{th}$ symbol $c_i$, the LLR value for this symbol to be equal to $\alpha_t$ is noted $LLR_t(c_i)$ and may be expressed as:

$$LLR_t(c_i) = -\log\left(\frac{p(c_i = \alpha_t | y_i)}{p(c_i = \beta_i | y_i)}\right) \quad (24)$$

Using such definition of the LLR metrics, the most reliable symbols are those that have smallest LLR values according to equation (24).

Step 1101 may be performed to receive at least three variable node messages $U_1, U_2, \ldots, U_{d_{cn}}$. Each variable node message $U_i$ may be written in a vector notation according to $$U_i = \begin{pmatrix} U_i[n_{m,in} - 1] \\ \vdots \\ U_i[1] \\ U_i[0] \end{pmatrix}$$

such that each variable node component $U_i[j]=(U_i^\oplus[j], U_i^+[j])$ for $j=0, \ldots, n_{m,in}-1$ comprises a symbol denoted by $U_i^\oplus[j]$ and the LLR metrics denoted by $U_i^+[j]$ associated with the symbol, and that the component carrying the most reliable symbol corresponds to the component $U_i[0]$, for $i=1, \ldots, d_{cn}$ and that $U_i^+[j] \leq U_i^+[j+1]$ for each $0 \leq j \leq n_{m,in}-2$.

The received variable node messages may be written in a set $UIN=(U_1, U_2, \ldots, U_{d_{cn}})$ as expressed in equation (2).

Step 1103 may be performed to determine permuted variable node messages $UP_1, UP_2, \ldots, UP_{d_{cn}}$ by applying one or more permutations $\pi_t$, for t=1, ..., Tmax, to the variable node messages in the set UIN depending on the reliability metrics $U_i^+[j]$ associated with the symbols $U_i^\oplus[j]$ comprised in the variable node messages $U_1, U_2, \ldots, U_{d_{cn}}$, each permutation $\pi_t$ being associated with a permutation index $j_t$, the permutation index taking values between 1 and $n_{m,in}$.

More specifically, given a permutation index $j_t$ (previously determined or stored in storage means), a permutation $\pi_t$ may be applied to permute two or more of the variable node messages in the set UIN according to the reliability metrics of the $j_t^{th}$ variable node components $U_i[j_t]$.

More precisely, the determination of permuted variable node messages using a permutation $\pi_t$ may be performed in four steps as follows:

1) Extracting, from the set of variable node messages UIN, the row-vector $P^{(t)}$ comprising the components $U_i[j_t]$ according to equation (3);
2) Determining a vector $SP^{(t)}$ by sorting the vector Pa) in a given order of the reliability metrics $U_i^+[j_t]$ comprised in the components $U_i[j_t]$ for i=1, ..., $d_{cn}$. The sorting may be performed in an increasing or decreasing order of the reliability metrics;
3) Determining, from the sorted vector $SP^{(t)}$, the permutation $\pi_t$ associated with the sorting of the vector $P^{(t)}$ such that the sorted vector $SP^{(t)}$ can be expressed as in equation (4).
4) Applying the permutation $\pi_t$ to the set of variable node messages UIN to obtain the set $UP^{(t)}=(UP_1^{(t)}, UP_2^{(t)}, \ldots, UP_{d_{cn}}^{(t)})$ of permuted variable node messages according to equation (5).

Accordingly, the permutation $\pi_t$ may be seen as a permutation of the set of indexes (1, 2, ..., $d_{cn}$) into the set $\pi_t(1, 2, \ldots, d_{cn})=(\pi_t(1), \pi_t(2), \ldots \pi_t(d_{cn}))$.

In some embodiments, the permuted variable node messages may be sorted according to a given order of the reliability metrics of the components comprised therein.

According to some embodiments, the number Tmax of the permutations $\pi_t$ may be predefined.

According to other embodiments, the number Tmax of the permutations $\pi_t$ may be determined based on one or more of a signal-to-noise ratio, the number $n_{m,in}$ of variable node components, the number $d_{cn}$ of variable node messages, the reliability metrics comprised in some of the variable node components, the algebraic structure of construction of the error correcting code $\mathcal{C}(n,K)$, and the number of iterations of the iterative decoding process.

For example, in one embodiment, the number Tmax of the vector permutations may be equal to one, i.e. Tmax=1 corresponding to one permutation $\pi=\pi_1$.

In such embodiments and when the variable node message are sorted and truncated, the permutation index may be advantageously equal to 1, i.e. $j_1=1$.

Accordingly, the variable node messages may be permuted in a way that the components $U_1[1], U_2[1], \ldots, U_{d_{cn}}[1]$ are sorted in a given order of the reliability metrics $U_i^+[1]$ for i=1, ..., $d_{cn}$. In such embodiments, step 1103 may consist of:

1) Extracting, from the set of variable node messages UIN, the row-vector P comprising the components $U_i[1]$ for i=1, ..., $d_{cn}$ according to equation (6);
2) Determining a vector SP by sorting the vector P into a given order (increasing or decreasing) of the reliability metrics $U_i^+[1]$ for i=1, ..., $d_{cn}$;
3) Determining, from the sorted vector SP, the permutation $\pi$ associated with the sorting of the vector P such that the sorted vector SP can be expressed as in equation (7);
4) Applying the permutation $\pi$ to the set of variable node messages UIN to obtain the set $UP=(UP_1, UP_2, \ldots, UP_{d_{cn}})$ of permuted variable node messages according to equation (8).

The permutation $\pi$ may be seen as a permutation of the set of indexes (1, 2, ..., $d_{cn}$) into the set $\pi(1, 2, \ldots d_{cn})=(\pi(1), \pi(2), \ldots, \pi(d_{cn}))$.

In addition, each of the permuted variable node messages may be sorted in a given order of the reliability metrics of the components $UP_i[j]=(UP_i^\oplus[j], UP_i^+[j])$ for j=0, ..., $n_{m,in}-1$. In particular, each permuted message may be sorted in an increasing order of the LLR metrics such that the component carrying the most reliable symbol corresponds to the component $UP_i[0]$, for i=1, ..., $d_{cn}$ and that $UP_i^+[j] \leq UP_i^+[j+1]$ for $0 \leq j \leq n_{m,in}-2$.

Step 1105 may be performed to determine a set of division parameters used to compute the check node messages by blocks. The set of block division parameters may be associated with the check node processing unit 25-cn configured to compute said check node messages.

According to some embodiments, the determination of the set of block division parameters may be performed in an offline mode, for example before the start of the iterative decoding process or the start of the message exchanges.

In other embodiments, the determination of the set of block division parameters may be performed online, during the iterative decoding process, for example.

In some embodiments of the invention, a set of block division parameters associated with a check node processing unit 25-cn may comprise at least:

a first block division parameter $N_B \geq 2$, representing the number of blocks check node messages or equivalently the number of sub-check nodes comprised in the check node processing unit 25-cn, and at least one second block division parameter $l^{(k)} \geq 1$ for k=1, ..., $N_B$, representing at least one check node message computed by a block of sub-check node. In some embodiments, a set of block division parameters associated with a check node processing unit 25-cn may comprise at least a first block division parameter $N_B \geq 2$ and a second block division parameter $l^{(k)} \geq 1$, k=1, ..., $N_g$.

According to some embodiments involving at least two check node processing units 25-cn for cn=1, 2, ..., n−K, a same set of block division parameters may be determined in association with each of the at least two check node processing units 25-cn. The same set of block division parameters may comprise a same first block division parameter and same second block division parameters in association with each one of the at least two check node processing units 25-cn.

In other embodiments involving at least two check node processing units 25-cn for cn=1, ..., n−K, different sets of block division parameters may be determined with at least two of said at least two check node processing units 25-cn, the different sets comprising different first block division parameters and/or different second block division parameters.

According to some embodiments, the set of block division parameters may be determined depending on the received variable node messages.

For example, in some embodiments in which a truncation of the variable node messages is applied, a set of block division parameters may be determined depending on the number $n_{m,in}$ of components comprised in the received variable node messages.

In another example, a set of block division parameters may be determined in association with at least one check node processing unit 25-*cn* for cn=1, ..., n−K depending on the degree $d_{cn}$ of the check node processing unit 25-*cn*.

Further, according to some embodiments, a set of block division parameters may be determined in association with at least one check node processing unit 25-*cn* depending on at least one parameter chosen in a group comprising a signal-to-noise ratio, the algebraic structure of construction of the used error correcting code $\mathcal{C}$ (n,K), and the number of iterations of the exchange of messages between the variable node processing units 27-*vn* and the check node processing units 25-*cn*.

The following description of some embodiments of the invention will be made with reference to a two-block computation of the check node messages using a set of division parameters $\{N_B=2, l^{(1)}=d_{cn}, l^{(2)}\geq 1;\}$, for illustration purposes only. However the skilled person will readily understand that the various embodiments of the invention may apply to any block computation of check node messages by three or more blocks. Further, a syndrome-based architecture will be used for determining the block of $d_{cn}$ check node messages $V_1, \ldots, V_{d_{cn}}$ and a forward-backward architecture will be used for determining the block of $l^{(2)}\geq 1$ check node messages $V_{\pi(l^{(1)}+1)}, V_{\pi(d_{cn})}$. Such a hybrid architecture is designated by mixe($l^{(1)}=d_{cn}, l^{(2)}\geq 1$).

Step 1107 may be performed to determine an initial binary value $UP_i^{DBV}[j]$ in association with each component $UP_i[j]$ for j=0, ..., $n_{m,in}$−1 comprised in the permuted variable node messages $UP_i$ for i=1, ..., $d_{cn}$.

According to some embodiments, the initial binary value associated with the components $UP_i[j]$ may depend on the reliability metrics $UP_i^+[j]$ associated with the symbols $UP_i^{\oplus}[j]$ comprised in said components. In particular, an initial binary value equal to a predefined first value may be associated with the component comprising the most reliable symbol and an initial binary value equal to a predefined second value may be associated with the remaining components.

According to some embodiments, the predefined first value may be equal to zero ('0') and the predefined second value may be equal to one ('1'). In such embodiments, the binary value associated with a component $UP_i[j]$ may be given by equation (13).

According to other embodiments, the predefined first value may be equal to one ('1') and the predefined second value may be equal to zero ('0'). Accordingly, the initial binary value associated with a component $UP_i[j]$ may be given by equation (14).

Step 1109 may be performed to determine a set $S=\{S_1, S_2, \ldots, S_{NS}\}$ of NS>1 syndromes from the permuted variable node messages, a syndrome $S_r=(S_r^{\oplus}, S_r^+, S_r^{DBV})$ for r=1, ..., NS comprising a GF(q) symbol $S_r^{\oplus}$, the reliability metrics $S_r^+$ associated with this symbol, and a binary vector $S_r^{DBV}$ comprising $d_{cn}$ bits, each bit $S_r^{DBV}[i]$, for j=1, ..., $d_{cn}$, being associated with the i$^{th}$ check node message $V_i$.

According to some embodiments, the symbols SP comprised in the syndromes $S_r$ for r=1, ..., NS may be determined from the symbols comprised in the components of the permuted variable node messages according to equation (11).

In some embodiments, the reliability metrics $S_r^{\oplus}$ comprised in the syndromes $S_r$ for r=1, ..., NS may be determined from the reliability metrics comprised in the components of the permuted variable node messages according to equation (12).

Further, the binary vector $S_r^{DBV}$ comprised in each syndrome $S_r$ for r=1, ..., NS may be determined from the initial binary values associated with the components comprised in the permuted variable node messages according to equation (15).

According to some embodiments, the number of syndromes NS may be greater than or equal to the number of components $n_{m,in}$ comprised in the permuted variable node messages and/or may depend on the order of the Galois Field.

For example, in GF(64), the number of syndromes may be given by NS=$3n_{m,out}$=$10n_{m,in}$, the number of components comprised in each check node message being typically $n_{m,out}$=20.

In another example considering GF(256), the number of syndromes may be given by NS=$3n_{m,out}$=$20n_{m,in}$, the number of check node components comprised in each check node message being typically $n_{m,out}$=60.

Still in another example for GF(1024), the number of syndromes may be given by NS=$3n_{m,out}$=$45n_{m,in}$, the number of check node components comprised in each check node message being typically $n_{m,out}$=150.

According to some embodiments, the set of syndromes S may be determined using elementary computations of intermediate messages determined individually from a first message and a second message, the first and second message being derived from the permuted variable node messages. More specifically, the set of syndromes may be determined by the intermediate message determined from all the permuted variable node messages.

According to some embodiments, an intermediate message $W_t'$, may comprise a number $n_t\geq 1$ of intermediate components, comprising each at least one symbol and its reliability metrics, and an intermediate binary vector associated with each intermediate component. The intermediate components may be sorted according to a given order of the reliability metrics of the symbols comprised therein.

According to some embodiments, the symbol comprised in an intermediate component of an intermediate message may be determined by applying an addition operation over the Galois Field (in general over the structure over which the error correcting code is constructed), said addition operation being applied to the symbol comprised in a component of the first message and to the symbol comprised in a component of the second message.

Moreover, the reliability metrics associated with a symbol comprised in an intermediate component of an intermediate message may be determined by applying an addition operation over a given algebraic structure to the reliability metrics comprised in a component of the first message and the reliability metrics comprised in a component of the second message.

According to some embodiments, the algebraic structure may be chosen in a group comprising the field $\mathbb{R}$ of real numbers, the field $\mathbb{Z}$ of integer numbers, and the field N of natural numbers.

For example in quantized hardware implementations and/or software implementations, the reliability metrics associated with the symbol comprised in an intermediate component of an intermediate message may be determined by applying an addition operation over the integer field $\mathbb{Z}$ or the field of natural numbers $\mathbb{N}$, enabling a complexity reduction.

Further, in some embodiments, each component of the first message and the second message may be associated with a binary vector derived from the initial binary values. In such embodiments, the intermediate binary vector associated with an intermediate component may be determined by applying a vector concatenation operation, the vector concatenation operation being applied to the binary vector associated with a component of the first message and to the binary vector associated with a component of the second message.

Depending on the stage of the computation of the intermediate message, the first and second messages may correspond to permuted variable node messages or to at least one intermediate message previously determined during the elementary computations.

According to some embodiments in which the first message and second message are different from the permuted variable node messages, the number of components processed from the first message and/or the number of components processed from the second message may correspond to the number of components comprised in an intermediate messages previously determined at earlier stages during the elementary computations.

For an intermediate message determined by processing two permuted variable node messages $UP_l$ and $UP_p$, for l and $p \neq l$ varying in the set of indices from 1 to d, an intermediate message denoted by $W_t'(UP_l, UP_p)$ may be determined from the components of the permuted variable node messages $UP_l$ and $UP_p$. The intermediate binary vector associated with each intermediate component of the intermediate message may be determined from the initial binary values associated with each component of the permuted variable node messages. Accordingly, an intermediate message $W_t'$ may comprise $n_t$ components $W_t'[j]$ for $j=0, \ldots n_t-1$ and an intermediate binary vector $W_t'^{DBV}[j]$ associated with each intermediate component $W_t'[j]$. An intermediate component $W_t'[j]=(W_t'^\oplus[j], W_t'^+[j])$ for $j=0, \ldots n_t-1$ may comprise a symbol $W_t'^\oplus[j]$ and the LLR metrics $W_t'^+[j]$ associated with the symbol.

According to some embodiments, an intermediate message may be determined by processing a number $n_l \leq n_{m,in}$ of components from the first message and/or a number $n_p \leq n_{m,in}$ of components from the second message.

According to some embodiments, an intermediate message may be determined through three steps as explained below.

At a first step, a set of auxiliary components may be determined from the components of the first message $UP_l$ and the components of the second message $UP_p$. An auxiliary component $B_t[u][v]$ is referred to as a "Bubble". It refers to the component obtained from the component $UP_l[u]$ comprised in the first message $UP_l$ and the component $UP_p[v]$ comprised in the second message $UP_p$. The index u varies in $0, 1, \ldots, n_l-1$ and the index v varies in $0, 1, \ldots, n_p-1$. The Bubble $B_t[u][v]=(B_t^\oplus[u][v]+B_t^+[u][v])$ may comprise a symbol $B_t^\oplus[u][v]$ and its associated reliability metrics $B_t^+[u][v]$.

In addition, a binary vector denoted by $B_t^{DBV}[u][v]$ may be associated with the Bubble $B_t[u][v]$.

The total number $NB_t$ of Bubbles may vary between $n_t$ and $n_l \times n_p$, i.e. may be higher than or equal to $n_t$ and lower than or equal to $n_l \times n_p$.

According to some embodiments, the symbol $B_t^\oplus[u][v]$ comprised in an auxiliary component $B_t[u][v]$ for $u=0, 1, \ldots, n_l-1$ and $v=0, 1, \ldots, n_p-1$ may be determined according to the addition over the Galois Field as previously expressed in equation (16).

According to some embodiments, the LLR metrics $B_t^+[u][v]$ comprised in an auxiliary component $B_t[u][v]$ for $u=0, 1, \ldots, n_l-1$ and $v=0, 1, \ldots, n_p-1$ may be determined according to equation (17).

According to some embodiments, the binary vector $B_t^{DBV}[u][v]$ associated with an auxiliary component $B_t[u][v]$ for $u=0, 1, \ldots, n_l-1$ and $v=0, 1, \ldots, n_p-1$ may be determined according to the vector concatenation operation as previously expressed in equation (18).

At a second step, the computed $NB_t$ auxiliary components may be sorted according to a given order (increasing or decreasing) of the LLR metrics comprised in each auxiliary component.

At a third step, a truncation operation may be performed to select, among the sorted auxiliary components, the $n_t$ components comprising the most reliable symbols, which provides the intermediate message $W_t'$ and the binary vector associated with each component of the $n_t$ components comprised in this intermediate message.

Further, the number $n_t$ of components comprised in an intermediate message may be lower than the number $NB_t$ of Bubbles taken into account.

According to some embodiments, a statistical pruning method may be applied for selecting the most reliable $n_t$ Bubbles among the determined potential Bubbles. The statistical pruning method may be based on a post-processing analysis of the Bubbles that effectively contribute to the computation of the check node messages.

The statistical pruning method may rely on a computation of a counter (or a score) in association with each Bubble, said counter enumerating, for a given error correcting code and/or a given signal-to-noise ratio, the recurrence of the contribution of a given Bubble to the computation of the check node messages. The counter $\gamma(B_t[u][v])$ associated with each Bubble $B_t[u][v]$ may be initialized to an initial value, for example equal to zero, and incremented during the decoding process according to equation (19) each time the Bubble $B_t[u][v]$ contributes to the calculation of the check node components.

Given the counters associated with each of the sorted $NB_t$ potential Bubbles, the $n_t$ Bubbles associated with the highest counters may be selected by suppressing the $NB_t-n_t$ Bubbles associated with the lowest counters according to equation (20).

Using the statistical pruning method, interesting simplifications, in terms of the number of Bubbles that may be retained to obtain an intermediate message, may be achieved thanks to the presorting of the variable node messages.

For example, in some embodiments, an intermediate message $W_t'$ comprising at least two intermediate components (i.e. $n_t \geq 2$) may be determined from a first message $UP_l$ comprising two or more components (i.e. $n_l \geq 2$) and a second message $UP_p$ comprising one component (i.e. $n_p=1$).

In another example, an intermediate message $W_t'$ comprising at least three intermediate components (i.e. $n_t \geq 3$) may be determined from a first message $UP_l$ comprising two or more components (i.e. $n_l \geq 2$) and a second message $UP_p$ comprising two components (i.e. $n_p=2$).

Still in another example, in some embodiments an intermediate message $W_t'$ comprising one intermediate component (i.e. $n_t=1$) may be determined from a first message $UP_l$ comprising one component (i.e. $n_l=1$) and a second message $UP_p$ comprising one component (i.e. $n_p=1$).

The set of syndromes may be determined from the intermediate message computed using all the permuted variable node messages. In particular, using a serial architecture, a tree architecture, or a hybrid architecture, the set of syndromes may be determined from the intermediate message delivered from the last elementary computation performed in the architecture.

Step 1111 may be performed to sort the syndromes $S_r$ in the set S according to a given order (increasing or decreasing) of the reliability metrics comprised in said syndromes. This step may be cancelled in embodiments in which the set of syndromes is determined using elementary computations since these computations provide sorted intermediate components and thus sorted syndromes.

Steps 1113 to 1117 may be performed to determine the check node messages of the block of $l^{(1)}=d_{cn}$ check node messages $VS_1, \ldots, VS_{d_{cn}}$.

Step 1113 may be performed to determine a candidate check node message $CV_i$ in association with each check node message $V_i$ for $i=1, \ldots, d_{cn}$ depending on the binary vectors $S_r^{DBV}$ comprised in the set of syndromes S. A candidate check node message $CV_i$ may comprise at least one candidate check node component $CV_i[z]$ comprising a symbol $C_i^{\oplus}[z]$ and a reliability metrics $CV_i^-[z]$ associated with said symbol. More specifically, the candidate check node components $CV_i[z]$ may be determined by selecting, among the syndromes $S_r$, with $r=1, \ldots, NS$, the syndromes which comprise binary vectors $S_r^{DBV}$ such that the bit $S_r^{DBV}[\pi^{-1}(i)]$ associated with the check node message $V_i$ is equal to a given value. The candidate check node components may accordingly correspond to the components comprised in the valid syndromes and the number of candidate check node components being equal to the number $NVS_i$ of selected valid syndromes.

In some embodiments, the given value may be equal to one ('1').

In other embodiments, the given value may be equal to zero ('0').

According to some embodiments, the symbol $CV_i^{\oplus}[z]$ comprised in a candidate check node component $CV_i[z]$, may be determined from the symbols comprised in the selected syndromes according to equation (21).

In some embodiments, the reliability metrics $CV_i^+[z]$ comprised in a candidate check node component $CV_i[z]$ may be determined from the reliability metrics comprised in the selected syndromes according to equation (22).

At step 1115, a redundancy elimination operation may be performed on the candidate check node components associated with each check node message of $VS_1, \ldots, VS_{d_{cn}}$ for keeping, among the components comprising the same symbol, the one which comprises the most reliable symbol.

Step 1117 may be performed to determine the check node components of each check node message of the block of check node messages $VS_1, \ldots, VS_{d_{cn}}$ by selecting a number $n_{m,out}-1$ of check node components from the candidate check node components processed in step 1115 depending on the reliability metrics associated with the symbols, the check node components comprising distinct symbols.

Step 1119 may be performed to determine $l^{(2)}$ permuted check node messages $V_{\pi(d_{cn}-l^{(2)}+1)}, \ldots, V_{\pi(d_{cn})}$ from at least one intermediate message determined during the elementary computations performed at step 1109 for the syndromes computation. More specifically, the determination of the permuted check node messages $V_{\pi(d_{cn}-l^{(2)}+1)}, \ldots, V_{\pi(d_{cn})}$ may be realized through the two following steps:

1) determining a candidate permuted check node message $CV_{\pi(i)}$ in association with each check node message $V_i$ for $i=d_{cn}-l^{(2)}+1, \ldots, d_{cn}$ at least from the intermediate message $W_t'(UP_{l;l\neq\pi(i)})$ determined from all the permuted variable node messages $UP_{l;l\neq\pi(i)}$ except the permuted variable node message $UP_i=U_{\pi(i)}$. A candidate permuted check node message $CV_{\pi(i)}$ may comprise candidate components derived at least from some of the intermediate components of the intermediate message $W_t'(UP_{l;l\neq\pi(i)})$, a candidate component comprising a symbol and a reliability metrics associated with this symbol. The candidate components may be further sorted according to a given order of the reliability metrics comprised in the intermediate components of the intermediate message $W_t'(UP_{l;l\neq\pi(i)})$.

2) determining a permuted check node message $V_{\pi(i)}$ from each candidate permuted check node message $CV_{\pi(i)}$ by performing a redundancy elimination and/or a selection of a predefined number of components $n_{m,out}$ based on the reliability metrics comprised in the candidate components.

Step 1121 may be performed to determine the check node messages $V_1, \ldots, V_{d_{cn}}$ from the check node messages $VS_1, \ldots, VS_{d_{cn}}$ determined in step 1117 and one of the permuted check node messages $V_{\pi(d_{cn}-l^{(2)}+1)}, \ldots, V_{\pi(d_{cn})}$ determined in step 1119. More specifically, a check node message $V_i$ of index i with $i=1, \ldots, d_{cn}$ may be determined by:

associating the check node message $V_i$ of index i with the permuted check node message $V_{\pi(x)}$ generated in step 1119 if the permuted index $\pi(x)$ (x taking values between $d_{cn}-l^{(2)}+1$ and $d_{cn}$) is equal to the index i, i.e. if $\pi(x)=i$ then $V_i=V_{\pi(x)}$;

associating the check node message $V_i$ of index i with the check node message $VS_i$ of index i delivered in step 1117 otherwise, i.e. $V_i=VS_i$ if there is no permuted index $\pi(x)$ that is equal to the index i.

The determined check node messages $V_1, \ldots, V_{d_{cn}}$ may be further processed in order to check if the parity-check equation is satisfied and decide whether to continue the iterative decoding process or to stop. More specifically:

if a maximum number of iterations is not yet reached and the parity-check equation is not satisfied, the check node messages may be processed for determining variable node messages;

if the processed signal satisfies the parity-check equation, the decoding process may terminate and the processed signal may be delivered as an estimate of the original codeword;

if a maximum number of iterations is reached without meeting all parity-check constraints, a decoding failure may be declared and the codeword estimated at the last iteration may be output as an estimate of the original codeword.

The architectures according to the embodiments of the invention accordingly provide optimal decoding performances with a significant reduction of the decoding computational complexity and implementation hardware cost in addition to a significant improvement in terms of latency.

Figure 12:
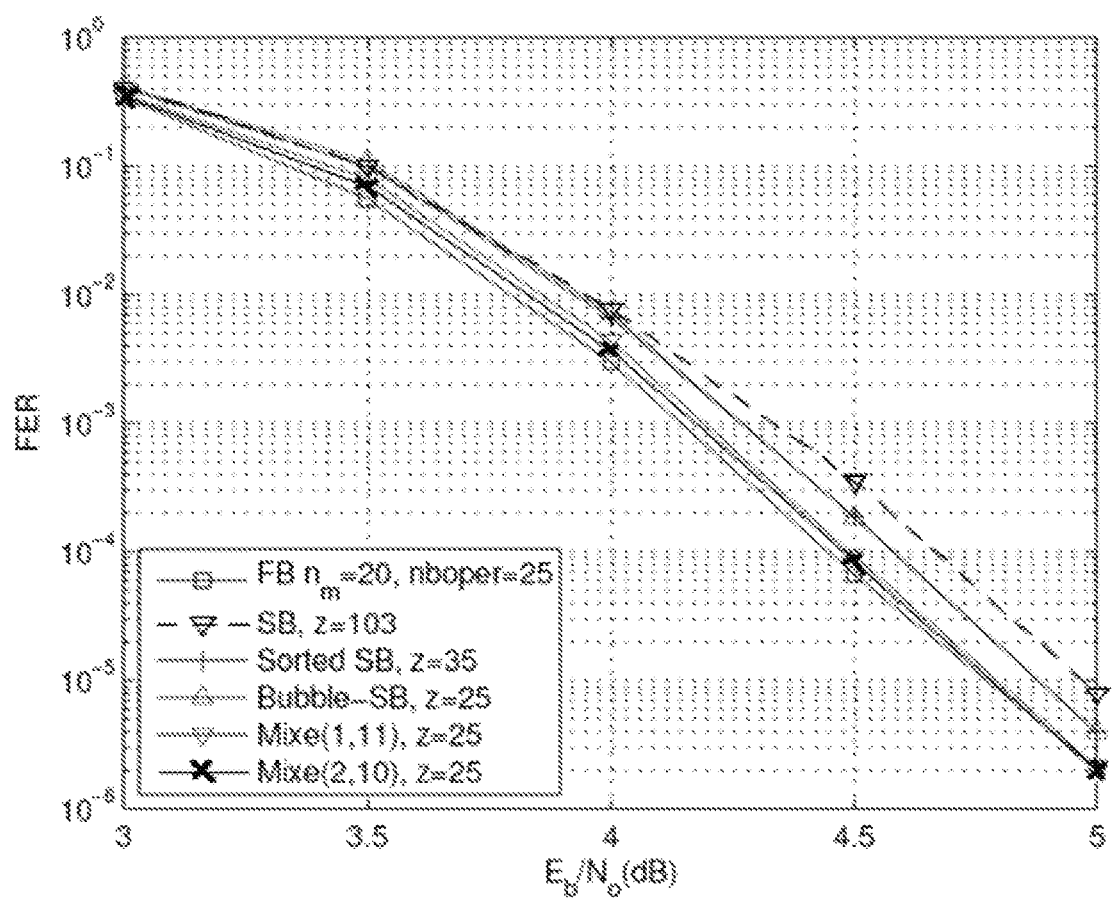
FIG. 12 is a diagram illustrating the Frame Error Rate obtained for decoding a non-binary LDPC code constructed over Galois Field GF(64) in a Gaussian transmission channel, according to some embodiments.

FIG. 12 illustrates the error probability performance, evaluated in terms of the Frame Error Rate, of decoding (576,480) non-binary LDPC code constructed over GF(64) under the Additive White Gaussian Noise channel using the EMS algorithm according to some embodiments of the invention. The code is regular, each of the check nodes in the Tanner Graph of this code being connected to $d_{cn}=12$ variable nodes, i.e. each check node processing unit being configured to compute 12 check node messages. The FER is evaluated for six implementations of the EMS algorithm as follows:

'FB $n_m=20$, noper=25' refers to a state of the art forward-backward implementation of the EMS algorithm in which all the check node messages are computed using a forward-backward architecture. $n_m=n_{m,in}$ designates the number of variable node components and noper designates the number of components of an elementary check node processor implemented in the forward-backward architecture without performing a redundancy elimination;

'SB, z=103' refers to a state of the art syndrome-based implementation of the EMS algorithm in which all the check node messages are computed using a syndrome-based architecture with a number of syndromes $z=103$;

'Sorted SB, $z=35$' refers to an implementation of the EMS algorithm based on a presorting of the variable node messages and a syndrome-based computation of all of the check node messages with a number of syndromes $z=35$;

'Bubble-SB, $z=25$' refers to an implementation of the EMS algorithm in which the check node messages are computed using a syndrome-based architecture, the computation of $z=25$ syndromes being performed using Bubbles;

'Mixe(1,11),$z=25$' refers to a presorted mixed implementation of the EMS algorithm in which one ('1') check node message is computed using a forward-backward architecture and eleven ('11') check node messages are computed using a syndrome-based architecture in which $z=25$ syndromes are derived;

'Mixe(2,10), $z=25$' refers to a presorted mixed implementation of the EMS algorithm in which two ('2') check node messages are computed using a forward-backward architecture and ten ('10') check node messages are computed using a syndrome-based architecture in which $z=25$ syndromes are derived.

Numerical results show that the proposed presorted mixed architectures combining a presorting of the variable node messages with mixed architectures of syndrome-based and forward-backward-based provide error probability gains over the state of the art implementations of the EMS algorithm in addition to the significant decoding complexity reduction in terms of latency and the hardware costs.

The methods and devices described herein may be implemented by various means. For example, these techniques may be implemented in hardware, software, or a combination thereof. For a hardware implementation, the processing elements of an iterative decoder 123 can be implemented for instance according to a hardware-only configuration (as example, in one or more FPGA, ASIC or VLSI integrated circuits with the corresponding memory) or according to a configuration using both VLSI and DSP.

While embodiments of the invention have been illustrated by a description of various examples, and while these embodiments have been described in considerable detail, it is not the intent of the applicant to restrict or in any way limit the scope of the appended claims to such details. Additional advantages and modifications will readily appear to those skilled in the art. The invention in its broader aspects is therefore not limited to the specific details, representative methods, and illustrative examples shown and described.

In particular, while the description of some embodiments of the invention has been performed with reference to a particular implementation of the EMS algorithm, it should be noted that the invention may be also applied to other iterative decoding algorithms such as the min-max algorithm.

Furthermore, while some embodiments of the invention have been described with reference to error correcting codes constructed over Galois Fields, the skilled person will readily understand that the proposed embodiments based on elementary check node processing for syndrome computation may be also applied to any LDPC codes and any graph error correcting code constructed over non-commutative groups such as polynomial codes (e.g. cyclic codes).

Further, even if the invention has some advantages in an application to communication systems, it should be noted that the invention is not limited to such communication devices and may be integrated in numerous devices such as data storage devices.

The methods described herein can be implemented by computer program instructions supplied to the processor of any type of computer to produce a machine with a processor that executes the instructions to implement the functions/acts specified herein. These computer program instructions may also be stored in a computer-readable medium that can direct a computer to function in a particular manner. To that end, the computer program instructions may be loaded onto a computer to cause the performance of a series of operational steps and thereby produce a computer implemented process such that the executed instructions provide processes for implementing the functions specified herein.

The invention claimed is:

1. A check node processing unit configured to determine at least two check node messages in a decoder to decode a signal encoded using a NB-LDPC code, the check node processing unit comprising:
   a data link to one or more message presorting units configured to determine at least three permuted variable node messages by permuting at least three variable node messages generated by one or more variable node processing units, each variable node message comprising components, a component comprising a symbol and a reliability metrics associated with said symbol;
   a syndrome sub-check node configured to determine check node messages from a set of syndromes, the set of syndromes being determined from one or more intermediate messages computed from the at least three permuted variable node messages;
   a forward-backward sub-check node configured to determine permuted check node messages at least from one of said one or more intermediate messages;
   a switching unit configured to generate each check node message of a given index from the check node messages determined by the at least one syndrome sub-check node or from the permuted check node messages determined at the at least a forward-backward sub-check node depending on said given index.

2. The check node processing unit of claim 1, wherein the message presorting unit is configured to determine said permuted variable node messages by applying one or more permutations to the at least three variable node messages depending on the reliability metrics comprised in said at least three variable node messages, each permutation being associated with components extracted from the variable node messages according to a permutation index and being applied to permute the variable node messages according to a given order of the reliability metrics comprised in said extracted components.

3. The check node processing unit of claim 1, configured to exchange said check node messages and at least three variable node messages with at least one variable node processing unit during a number of iterations, the one or more message presorting units being configured to determine the number of said one or more permutations based on one or more of a signal-to-noise ratio, a number of components comprised in said at least three variable node messages, the reliability metrics comprised in some of the components in said at least three variable node messages, the NB-LDPC code, and said number of iterations.

4. The check node processing unit of 1, wherein the syndrome sub-check node comprises a syndrome calculation unit configured to determine the set of syndromes from the at least three permuted variable node messages, a syndrome comprising a symbol, a reliability metrics associated with said symbol and a binary vector comprising a binary value in association with each of the at least two check node messages, the syndrome calculation unit being configured to:
- determine the symbol comprised in each syndrome by applying, to at least some of the symbols comprised in the at least three permuted variable node messages, an addition operation over an algebraic structure;
- determine the reliability metrics associated with each symbol comprised in each syndrome by applying an addition operation over a given algebraic structure chosen in a group comprising the field of real numbers, the field of integer numbers, and the field of natural numbers, the addition operation being applied to at least some of the reliability metrics comprised in the at least three permuted variable node messages.

5. The check node processing unit of claim 4, wherein the syndrome calculation unit is configured to determine an initial binary value in association with each component of the at least three permuted variable node messages depending on the reliability metrics associated with the symbols comprised in said at least three permuted variable node messages, the syndrome calculation unit being further configured to determine the binary vector comprised in each syndrome by applying a vector concatenation operation to the initial binary values associated with at least some of the components comprised in the at least three permuted variable node messages.

6. The check node processing unit of claim 5, wherein the syndrome calculation unit is configured to determine, for each of the least three permuted variable node messages, an initial binary value equal to a predefined first value in association with the component comprising the most reliable symbol and an initial binary value equal to a predefined second value in association with the remaining components.

7. The check node processing unit of claim 1, wherein the syndrome sub-check node is configured to determine said one or more intermediate messages using at least one elementary check node processors, an elementary check node processor being configured to determine an intermediate message from a first message and a second message, said first message and second message being derived from said at least three permuted variable node messages, an intermediate message comprising one or more intermediate components and intermediate binary vectors associated with each intermediate component, each intermediate component comprising a symbol and a reliability metrics associated with said symbol, said one or more intermediate components being sorted according to a given order of the reliability metrics, the set of syndromes being determined from the intermediate message determined from all of the at least three permuted variable node messages.

8. The check node processing unit of claim 7, wherein an elementary check node processor is configured to:
- determine a set of auxiliary components from the components of said first message and second message, an auxiliary component comprising a symbol and a reliability metrics associated with said symbol;
- sort the auxiliary components according to a given order of the reliability metrics comprised in said auxiliary components;
- determine a counter in association with each auxiliary component, said counter being determined depending on a signal-to-noise ratio and/or on the NB-LDPC code;
- determine the intermediate components by selecting, among the auxiliary components, components depending on the counters associated with said auxiliary components.

9. The check node processing unit of claim 7, comprising an elementary check node processor configured to determine an intermediate message from a first message comprising two or more components and a second message comprising one component, said intermediate message comprising at least two intermediate components.

10. The check node processing unit of claim 7, comprising an elementary check node processor configured to determine an intermediate message from a first message comprising two components and a second message comprising two or more components, the determined intermediate message comprising at least three intermediate components.

11. The check node processing unit of claim 7, comprising an elementary check node processor configured to determine an intermediate message comprising one intermediate component, said one intermediate component being determined from the most reliable component comprised in a first message and the most reliable component comprised in a second message.

12. The check node processing unit of claim 1, wherein the syndrome sub-check node further comprises:
- a decorrelation and permutation unit configured, for each check node message of a given index, to:
  - determine a permuted index by applying to said given index the inverse of the one or more permutations;
  - select valid syndromes in the set of syndromes, a valid syndrome comprising a binary value associated with said permuted index equal to a given value;
  - determine, candidate check node components from said valid syndromes;
- a selection unit configured to determine check node messages by selecting, among each candidate check node message, a predefined number of components depending on the reliability metrics comprised in the candidate check node components.

13. The check node processing unit of claim 1, wherein the forward-backward sub-check node comprises:
- a calculation unit configured to determine, at least from one intermediate message, a candidate permuted check node message in association with each of the check node messages, a candidate permuted check node message comprising one or more candidate components comprising each a symbol and a reliability metrics associated with said symbol;
- a processing unit configured to determine a permuted check node message from each candidate permuted check node message depending on the reliability metrics comprised in the candidate components.

14. The check node processing unit of claim 1, wherein the switching unit is configured to determine each check node message of a given index by:
- associating said each check node message with one of the permuted check node messages determined by the forward-backward sub-check node if the index of said one of the permuted check node messages is equal to said given index;
- associating said each check node message with one of the check node messages determined by the syndrome sub-check node if none of the permuted check node messages is of an index equal to said given index.

15. The check node processing unit of claim 1, wherein the decoder comprises at least two check node processing units and at least one block division unit, the block division unit being configured to perform a division of at least one check node processing unit into at least one syndrome sub-check node and at least one forward-backward sub-check node at least one of the at least two check node processing units being not divided into blocks of sub-check nodes.

16. A method of determining at least two check node messages in a check node processing unit, the method comprising:

acquiring from one or more message presorting units at least three permuted variable node messages by permuting at least three variable node messages generated by one or more variable node processing units;

determining at a syndrome sub-check node check node messages from a set of syndromes, the set of syndromes being determined from one or more intermediate messages computed from the at least three permuted variable node messages;

determining at a forward-backward sub-check node permuted check node messages at least from one of said one or more intermediate messages;

determining at a switching unit each check node message of a given index from the check node messages determined by the at least one syndrome sub-check node or from the at least one permuted check node message determined by the at least one forward-backward sub-check node depending on said given index.

* * * * *